United States Patent [19]

Sakai et al.

[11] 4,379,001
[45] Apr. 5, 1983

[54] METHOD OF MAKING SEMICONDUCTOR DEVICES

[75] Inventors: Tetsushi Sakai, Sayama; Yoshiji Kobayasi, Tokyo; Yousuke Yamamoto, Musashino; Hironori Yamauchi, Asaka, all of Japan

[73] Assignee: Nippon Telegraph & Telephone Public Corp., Tokyo, Japan

[21] Appl. No.: 58,417

[22] Filed: Jul. 18, 1979

[30] Foreign Application Priority Data

Jul. 19, 1978 [JP] Japan .................................. 53-87996
Jul. 19, 1978 [JP] Japan .................................. 53-87997

[51] Int. Cl.³ ................... H01L 21/263; H01L 21/20; H01L 21/22
[52] U.S. Cl. ....................................... 148/1.5; 29/571; 29/578; 29/591; 29/576 B; 148/187; 357/59; 357/91
[58] Field of Search ................... 148/1.5, 187; 29/578, 29/571, 591, 576 B; 357/59, 91

[56] References Cited

U.S. PATENT DOCUMENTS

| 4,074,300 | 2/1978 | Sakai | 357/23 |
| 4,074,304 | 2/1978 | Shiba | 357/59 |
| 4,125,426 | 11/1978 | Inayoshi et al. | 148/1.5 |
| 4,148,054 | 4/1979 | Hart et al. | 357/44 |
| 4,157,269 | 6/1979 | Ning et al. | 148/1.5 |
| 4,162,506 | 7/1979 | Takei | 357/59 |
| 4,188,707 | 2/1980 | Asano et al. | 29/591 |
| 4,234,357 | 11/1980 | Schepple | 148/1.5 |
| 4,240,845 | 12/1980 | Esch et al. | 148/1.5 |
| 4,274,891 | 6/1981 | Silvestri et al. | 148/175 |
| 4,290,185 | 9/1981 | McKenny et al. | 29/571 |
| 4,296,426 | 10/1981 | Giles | 357/23 |
| 4,306,915 | 12/1981 | Shiba | 148/1.5 |
| 4,313,255 | 2/1982 | Shinozaki et al. | 148/1.5 |

FOREIGN PATENT DOCUMENTS 1417170 12/1975 United Kingdom .

OTHER PUBLICATIONS

Jinno et al., J. Electrochem. Soc., 125 (May, 1978) 827.

Primary Examiner—Upendra Roy
Attorney, Agent, or Firm—Townsend and Townsend

[57] ABSTRACT

In a semiconductor device such as a bipolar transistor and a field effect transistor of the type having a substrate, a doped polycrystalline silicon region selectively formed on the substrate and an insulating film overlying the polycrystalline silicon region, the region is shaped as mesa having side surfaces with a negative coefficient of gradient between the substrate and the top of the mesa.

6 Claims, 57 Drawing Figures

F I G. 8o
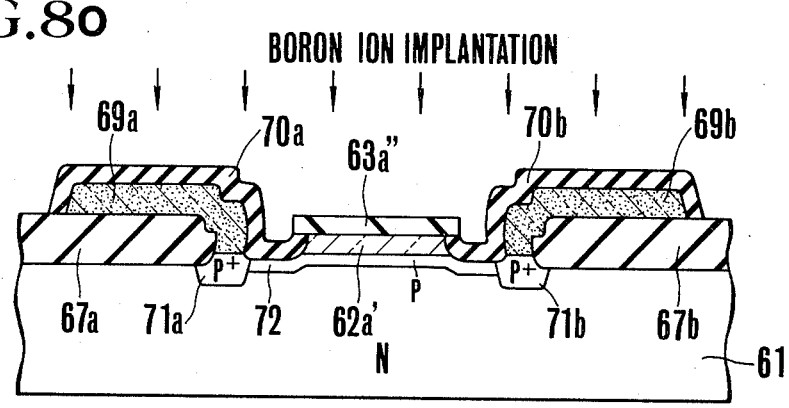
F I G. 8p
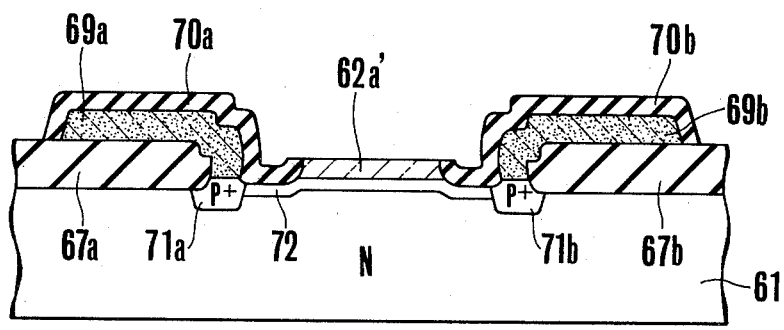

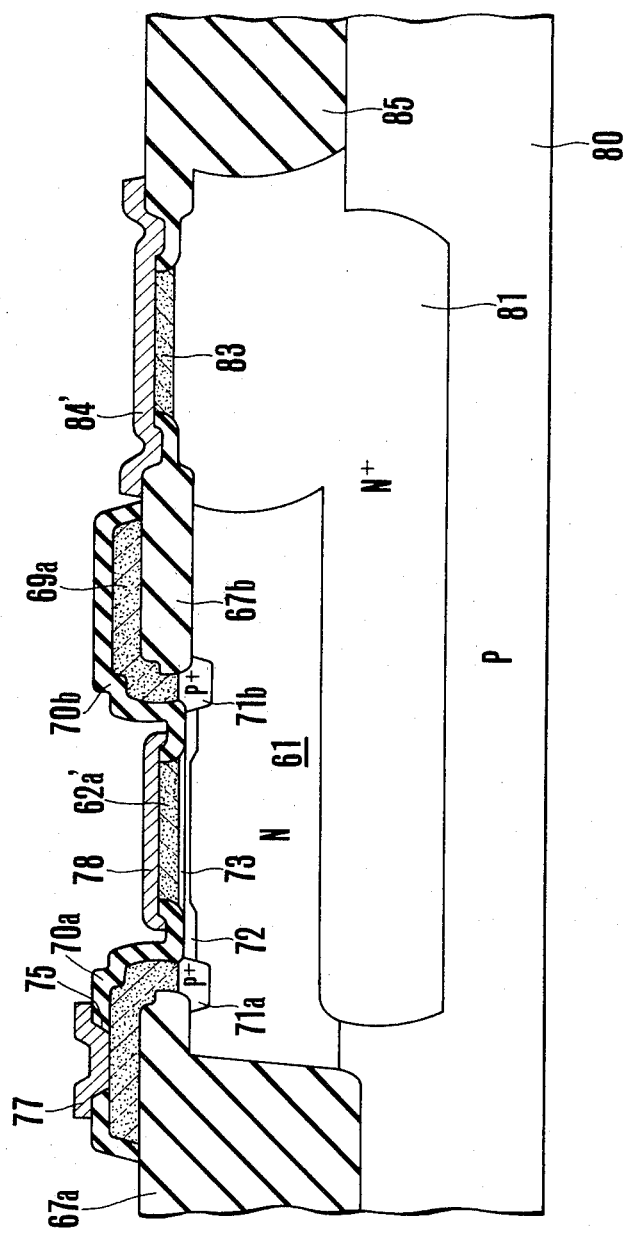

METHOD OF MAKING SEMICONDUCTOR DEVICES

BACKGROUND OF THE INVENTION

This invention relates to a semiconductor device and a method of manufacturing the same, more particularly to a construction of a doped polycrystalline silicon region formed on a semiconductor or an insulation substrate, an insulation isolating structure between the doped polycrystalline silicon region and another regions, a bipolar transistor utilizing the doped polycrystalline silicon region, a junction type field effect transistor and a method of manufacturing the same.

Recent efforts in the development of IC semiconductor technique have been concentrated in the area of increasing the density of the integrated circuits, improving the performance of such circuits simplifying the manufacturing steps for such circuits. To attain these objects it has been proposed to variously change combinations of a polycrystalline semiconductor layer and a semiconductor substrate or such insulating films as $SiO_2$ and $Si_3N_4$ films to be formed on the semiconductor substrate. However, each of these combinations is not yet perfect and for long years it has been desired to develop semiconductor devices and methods of manufacturing the same capable of improving the density, and the performance and simplifying the manufacturing process.

For a better understanding of the invention, one prior art technique will be described hereunder. For example, consider a case wherein an insulating film such as a $SiO_2$ film, is formed on a silicon substrate, and a wiring layer comprising a polycrystalline silicon layer is formed on the insulating film, or an electrode of a transistor is formed on the substrate. One prior art method comprises the steps of forming a polycrystalline silicon layer on the insulating film, depositing a photoresist on the polycrystalline silicon layer and then chemically etching off unnecessary portions of the polycrystalline silicon layer by using the photoresist. In the case of a polycrystalline silicon doped with boron at a density of about $10^{21}$ atoms/cm$^3$, an etchant consisting of $HF:HNO_3:H_2O=1:20:20$ is suitable. With this method, however, the spacing between adjacent wiring layers or electrodes and the substrate is determined by a minimum gap that permits formation of a photoresist pattern. This minimum gap is generally of the order of 3 microns. For this reason, when a transistor is prepared with this method not only is the base resistance relatively large, but also the parasitic collector-base capacitance is also large. Where the polycrystalline silicon layer is worked with only chemical etching, the portions of the polycrystalline silicon layer underlying the photoresist and which should be retained to form a wiring layer or an electrode would be etched off (side etching) with the result that the spacing between adjacent wiring layers would become larger than expected. Moreover, due to the effect of the side etching, the cross-sectional configuration becomes a mesa which has a smaller area than expected, thus limiting the current capacity of the wiring layer.

According to another prior art method, the polycrystalline silicon layer on the oxide film is etched off with plasma by using a photoresist pattern disposed on the polycrystalline silicon layer as disclosed in J. Electrochem. Soc.: "Solid-State Sience and Technology", May 1978, Vol. 125 No. 5, page 827–828. With this method, the polycrystalline silicon layer would be worked to have a desired mask configuration, that is to cause the cross-sectional configuration of the wiring pattern to have a rectangular configuration as determined by the photoresist pattern. Similar to the chemical etching, the spacing to the adjacent wiring layer, however, is determined by the working accuracy of the photoresist so that the minimum gap is of the order of about 3 microns. Moreover, as the edges of the wiring layer are sharp, there is a fear of breaking the layer or wires by such sharp edges. The base resistance and the collector-base parasitic capacitance are also high as in the case of the chemical etching.

Still another prior art method comprises the steps of forming a layer of a material having a lower oxidizing speed than polycrystalline silicon, for example $Si_3N_4$, and having a predetermined pattern on a polycrystalline silicon layer on an oxide film, selectively thermally-oxidizing the polycrystalline silicon layer so as to form an isolated region of the polycrystalline silicon layer, that is a wiring layer or an electrode. This method is disclosed in U.S. Pat. No. 4,074,304. However, this method presents the same problem as first described method.

According to yet another prior art method an insulating film is selectively formed on a polycrystalline silicon layer formed on an oxide film, and an impurity such as boron is diffused into a portion of the polycrystalline silicon layer not covered by the insulating film. The insulating film formed on the polycrystalline silicon layer is selectively removed and thereafter the portion of the polycrystalline silicon not containing the impurity is removed by using the difference in the etching speeds between the portions containing and not containing the impurity when a KOH type etchant is used. This method is disclosed, for example, in British Pat. No. 1,417,170.

According to this method, since the impurity selectively thermally-diffuses into the portion of the polycrystalline silicon layer under a selectively arranged insulating film, it is possible to form a wiring layer diffused with the impurity with closer interlead spacing (for example with a spacing of less than 2 microns) than those formed by various methods aforementioned. However, the wiring layer would have overhang edges which project toward adjacent wiring layers. Consequently, although the cross-sectional area of the wiring layer becomes larger but, using this method the sharp edges damage an insulating layer or a wiring layer formed thereon.

Where a transistor is prepared according to one of many well known methods, it is necessary to use at least four photoetching steps for forming a base diffusion opening, an emitter diffusion window, a base electrode lead window and an electrode forming window and it is necessary to use various photomask patterns for defining the contour of respective performance regions. For this reason, in order to produce a high density and high performance transistor, it is necessary to align the respective photoetching positions and to work at a high degree of accuracy. This decreases the yield, making it difficult to obtain extremely precise transistors.

To solve these problems we have already proposed a method as disclosed in our copending U.S. patent application Ser. No. 898,074 filed on Apr. 20, 1978.

In a transistor disclosed therein, a base electrode comprising a polycrystalline layer having a constant width is disposed adjacent a boundary and around the entire periphery of a base region surface formed on a semiconductor substrate and having a base contact about the periphery, an emitter electrode comprising polycrystalline silicon is formed on the surface of an island-shaped emitter region formed in the base region, and the base and emitter electrodes are electrically isolated by an insulating film.

With this construction, however, when forming the emitter electrode wherein a polycrystalline silicon layer is provided beneath the emitter electrode for the purpose of stabilizing the electrode for a thin emitter junction, the polycrystalline silicon layer is required to completely cover the emitter region so that it is necessary to increase the peripheral dimension of the emitter region by taking into consideration a position aligning allowance. This hinders manufacture of extremely fine transistors. Further, with this construction, it is necessary to determine the position of the emitter-base junction at a portion which is in contact with the insulating film of a small width and serves to isolate the base electrode from the emitter electrode so that the position of the side junction of the emitter electrode is determined according to the relationship between the depth of the base contact region and the emitter depth. This determines the insulating strength between the emitter and base electrodes and since the breakdown voltage is determined by controlling the lateral dispersion, the electrical characteristics of the resulting transistors are not always uniform. With this construction, the side wall of the emitter electrodes comprises a p-n junction between regions each having a high impurity concentration, thus increasing the parasitic capacitance and decreasing $f_T$. Moreover, according to this construction, the emitter electrode is formed as a fourth layer with respect to the substrate thus complicating the manufacturing steps of such multilayer construction and rendering it difficult to obtain high density integrated circuits.

SUMMARY OF THE INVENTION

Accordingly, it is the principal object of this invention to provide a semiconductor device provided with a conductive layer having at least a predetermined sectional area and capable of providing multilayer wirings and a method of fabricating such a semiconductor device.

Another object of this invention is to provide a semiconductor device and a method of manufacturing the same capable of providing high speed transistors having uniform electrical characteristics.

Still another object of this invention is to provide an improved semiconductor device and a method of manufacturing the same which uniquely utilizes a self-aligning technique and can minimize use of highly accurate photomasks.

Yet another object of this invention is to provide a semiconductor device and a method of manufacturing the same capable of providing extremely fine transistors without the problems of position alignment and working accuracy when photoetching the base regions.

A further object of this invention is to obtain a semiconductor device which is made flat thereby increasing the density of the integrated circuits, and a method of manufacturing such a semiconductor device.

A further object of this invention is to provide an improved semiconductor device and a method of manufacturing the same which can increase the density of the integrated circuits while decreasing the parasitic capacitance and the resistivity of the elements thus increasing the operating speed and decreasing power consumption.

According to one aspect of this invention there is provided a semiconductor device of the type comprising a semiconductor substrate, a doped polycrystalline silicon region selectively formed on the substrate, and an insulating film overlying the polycrystalline silicon region, wherein the region is in the form of a projection having a side surface with a negative coefficient of gradient between a portion of the projection at or near the substrate and the upper end of the projection.

According to one embodiment of this invention, there is provided a semiconductor device comprising a substrate; first, second and third doped polycrystalline silicon regions; and an insulating film overlying the first to third doped polycrystalline silicon region, wherein the first and third doped polycrystalline silicon regions are in the form of projections each having a negative coefficient of gradient between a portion of the projection at or near the substrate and the upper end of the projection, and the second region is positioned between the first and third regions and shaped in the form of a mesa having side surfaces with a generally positive coefficient of gradient.

According to a modification of this invention, there is provided a bipolar transistor of the type comprising a semiconductor substrate of a first conductivity type and acting as a collector region; an island shaped base region of a second conductivity type formed on the surface of the semiconductor substrate and surrounded by a first insulating film; a first conductivity type emitter region formed in the base region; a doped polycrystalline silicon region of the first conductivity type, the doped polycrystalline silicon region being in the form of a mesa adjacent the emitter region and acting as an emitter electrode, a second conductivity type base contact in contact with the periphery of the base region; and a doped polycrystalline silicon region of the second conductivity type contiguous with the base contact and extending in the direction of the first insulating film, the doped polycrystalline silicon region of the second conductivity type acting as a base electrode, wherein the doped polycrystalline silicon region of the second conductivity type takes the form of a projection, one side surface of the projection adjacent the doped polycrystalline silicon region of the first conductivity type having a negative coefficient of gradient between a portion of the projection at or near the projection and the upper end of the projection, and wherein the bipolar transistor further comprises a second insulating film covering substantially the entire surface of the substrate, and a wiring layer interconnecting the respective doped polycrystalline silicon regions and the other elements.

According to another embodiment of this invention, there is provided a junction type field effect transistor of the type comprising a semiconductor type substrate of a first conductivity type; a first insulating film forming an island shaped region on one surface of the semiconductor substrate; source and drain regions of a second conductivity type formed on a non-implanted portion of the semiconductor substrate adjacent the first insulating film defining the island shaped region; a doped polycrystalline silicon region of a second conductivity type extending from the source and drain regions onto the first insulating film and acting as source and drain electrodes respectively; a region of the second conductivity type formed in the island shaped region of the semiconductor substrate; a mesa shaped polycrystalline silicon region of the second conductivity type formed on the gate region and acting as a gate electrode; a second film covering substantially the entire surface of the substrate; and a wiring layer interconnecting respective doped polycrystalline silicon regions and the other elements, wherein the doped polycrystalline region utilized as the source and drain electrodes takes the form of a projection, one side surface of the projection adjacent the doped polycrystalline silicon region utilized as the gate electrode having a generally negative coefficient of gradient between a portion of the projection at or near the substrate and the top of said projection.

According to another aspect of this invention, there is provided a method of manufacturing a semiconductor device comprising the steps of; forming a polycrystalline semiconductor layer on a substrate; sequentially forming first and second insulating films having different etching characteristics on the polycrystalline semiconductor layer; etching the second insulating film in accordance with a predetermined mask pattern; etching the first insulating film by using remaining portions of the second insulating film as a mask; implanting ions of an impurity into an exposed portion of the polycrystalline semiconductor layer by using remaining portions of the first and second insulating film as masks; side etching the remaining portion of the first insulating film to expose a non-implanted portion of the polycrystalline semiconductor layer; etching the exposed non-implanted portion of the polycrystalline semiconductor layer to form a projection having side surfaces with a negative coefficient of gradient between a portion of the projection at or near the substrate and the upper end of the projection; and covering the surface of the substrate with an insulating film.

According to another embodiment of this invention, there is provided a method of manufacturing a semiconductor device comprising the steps of; forming a polycrystalline semiconductor layer on a substrate; sequentially forming first and second insulating films having different etching characteristics on the polycrystalline semiconductor layer; etching the second insulating film in accordance with a predetermined mask pattern; etching the first insulating film by using remaining portion of the second insulating film as a mask; side etching the remaining portion of the first insulating film to expose a non-implanted portion of the polycrystalline semiconductor layer; implanting ions of the impurity into the exposed portion of the polycrystalline semiconductor layer by using remaining portions of the first and second insulating films as masks; etching the exposed portion of the polycrystalline semiconductor layer non-implanted with the ions to form a projection with side surfaces having a negative coefficient of gradient between a portion of said projection at or near the substrate and the upper end of the projection; and covering the surface of the substrate with an insulating film.

According to another embodiment of this invention, there is provided a method of manufacturing a semiconductor device comprising the steps of; forming a polycrystalline semiconductor layer on a substrate; sequentially forming first and second insulating films having different etching characteristics on the polycrystalline semiconductor layer; etching the second insulating film in accordance with a predetermined mask pattern; etching the first insulating film by using remaining portion of the second insulating film as a mask; implanting ions of an impurity into an exposed surface of the polycrystalline semiconductor layer by using remaining portions of the first and second insulating films as masks; side etching the remaining portion of the first insulating film to expose a non-implanted portion of the polycrystalline semiconductor removing the second insulating film; etching the exposed non-implanted portion of the polycrystalline semiconductor to insulate and separate the ion-implanted polycrystalline semiconductor layer from the adjacent non-implanted polycrystalline semiconductor layer, thus forming a projection on the ion-implanted polycrystalline semiconductor layer, the projection with a side surface having a negative coefficient of gradient between a portion on the projection at or near the substrate and the upper end of the projection, and providing for the non-implanted polycrystalline semiconductor layer a concave side edge having a positive coefficient gradient between a portion at or near the substrate and one end of the concave side edge; covering on surface of the substrate with a fourth insulating film; removing the first insulating film overlying the non-implanted portion of the polycrystalline semiconductor layer; doping an impurity into non-implanted portion of the polycrystalline semiconductor region; and covering the surface of the substrate with a fifth insulating film.

According to another embodiment of this invention, there is provided a method of manufacturing a semiconductor device comprising the steps of; forming a polycrystalline semiconductor layer on a substrate; sequentially forming first and second insulating films having different etching characteristics on the polycrystalline semiconductor layer; etching the second insulating film in accordance with a predetermined mask pattern; etching the first insulating film by using remaining portions of the second insulating film as a mask; side etching the remaining portion of the first insulating film to expose a non-implanted portion of the polycrystalline semiconductor layer; implanting the the ions of an impurity into an exposed surface of the polycrystalline semiconductor layer by using remaining portions of the first and second insulating films as masks; removing the second insulating film; etching the exposed non-implanted portion of the polycrystalline semiconductor layer to insulate and separate the ion-implanted polycrystalline semiconductor layer from the adjacent non-implanted polycrystalline semiconductor layer not-implanted with the ions, thus forming a projection on the ion-implanted polycrystalline semiconductor, the projection having a side surface with a negative coefficient of gradient between a portion on the projection at or near the substrate and the upper end of the projection, and providing for the non-implanted polycrystalline semiconductor layer a concave side edge having a positive coefficient of gradient between a portion at or near the substrate and one end of the concave side edge; covering one surface of the substrate with a fourth insulating film; removing the first insulating film overlying the non-implanted portion of the polycrystalline semiconductor layer; doping an impurity into be non-implanted portion of polycrystalline semiconductor layer; and covering the surface of substrate with a fifth insulating film.

According to another embodiment of this invention, there is provided a method of manufacturing a semiconductor device comprising the steps of; forming a polycrystalline semiconductor layer on a substrate; sequentially forming first and second insulating films having different etching characteristics on the polycrystalline semiconductor layer; etching the second insulating film according to a predetermined mask pattern; etching the first insulating film by using a remaining portion of the second insulating film as a mask; implanting ions of an impurity into an exposed portion of the polycrystalline semiconductor layer by using remaining portions of the first and second insulating films as masks; side etching the remaining portion of the first insulating film for exposing a non-implanted portion of the polycrystalline semiconductor layer; etching the exposed non-implanted portion of the polycrystalline semiconductor layer thus separating an ion-implanted polycrystalline semiconductor region from a non-implanted polycrystalline semiconductor region having a relatively thin thickness; thermally oxidizing the substrate so as to oxidize the relatively thin non-implanted polycrystalline semiconductor region to insulate and separate the same from the ion-implanted polycrystalline semiconductor region, thus providing for the insulated and separated polycrystalline semiconductor region a projection having a side surface with a negative coefficient of gradient between a portion of the projection at or near the substrate and one end of the projection, and providing for the insulated and separated polycrystalline semiconductor region a mesa having a positive coefficient of gradient at or near the substrate; removing the insulating film covering the non-implanted polycrystalline semiconductor region; doping an impurity into the non-implanted polycrystalline semiconductor region; and covering the substrate surface with a third insulating film.

According to another embodiment of this invention, there is provided a method of manufacturing a semiconductor device comprising the steps of; forming a polycrystalline semiconductor layer on a substrate; sequentially forming first and second insulating films having different etching characteristics on the polycrystalline semiconductor layer; etching the second insulating film according to a predetermined mask pattern; etching the first insulating film by using a remaining portion of the second insulating film as a mask; side etching the remaining portion of the first insulating film for exposing a non-implanted portion of the polycrystalline semiconductor layer; implanting ions of an impurity into an exposed portion of the polycrystalline semiconductor layer by using remaining portions of the first and second insulating films as masks; etching the exposed non-implanted portion of the polycrystalline semiconductor layer thus separating an ion-implanted polycrystalline semiconductor region from a polycrystalline semiconductor region having a relatively thin thickness; thermally-oxidizing the substrate surface so as to oxidize the relatively thin non-implanted polycrystalline semiconductor region to insulate and separate the same from the ion implanted polycrystalline semiconductor region, thus providing for the insulated and separated polycrystalline semiconductor region a projection having a side surface with a negative coefficient of gradient between a portion of the projection at or near the substrate and one end of the projection, and providing for the insulated and separated polycrystalline semiconductor region a mesa having a positive coefficient of gradient at or near the substrate; removing the insulating film covering the non-implanted polycrystalline semiconductor region; doping an impurity into the non-implanted polycrystalline semiconductor region; and covering the substrate surface with a third insulating film.

According to another embodiment of this invention, there is provided a method of manufacturing a bipolar transistor comprising the steps of; selectively oxidizing a semiconductor substrate of a first conductivity type for forming a first insulator region extending into the substrate and for simultaneously forming a base diffusion window surrounded by the region; forming a base region having a second conductivity type through the window; forming a polycrystalline silicon layer, and second and third insulating layers having different etching characteristics on the substrate; selectively etching the third insulating layer to form a third insulation region on the base region and near the central portion thereof; etching the second insulating layer to form a second insulating region by using the third insulating region as a mask; implanting ions of an impurity having the same conductivity type as the base region into the polycrystalline silicon layer by utilizing the second and third insulating regions as masks, thereby separating the same into a region implanted with the ions and a region not-implanted with the ions; side etching the second insulating region for exposing the non-implanted polycrystalline silicon region; etching the non-implanted region not-implanted with the ions to insulate and separate the implanted region from the non-implanted region; forming a thermal oxide film on the surface of the substrate and at the same time diffusing an impurity in the ion implanted region contiguous to the base region into the same for forming a base contact; removing the insulating film to expose the non-implanted polycrystalline silicon region; diffusing an impurity of the first conductivity type into the exposed polycrystalline silicon region to form an emitter region of the first conductivity type in the base region of the semiconductor substrate; and forming wiring layers in the ion-implanted region and in the regions diffused with the impurity of the first conductivity type.

According to another embodiment of this invention, there is provided a method of manufacturing a bipolar transistor comprising the steps of; selectively oxidizing a semiconductor substrate of a first conductivity type for forming a first insulator region extending into the substrate and for simultaneously forming a base diffusion window surrounded by the region; forming a base region having a second conductivity type through the window; forming a polycrystalline silicon layer, and second and third insulator layers having different etching characteristics on the substrate; selectively etching the third insulating layer to form a third insulating region on the base regin and near the central portion thereof; etching the second insulating layer to form a second insulating regin by using the third insulating region as a mask; side etching the second insulating region for exposing the polycrystalline silicon region; implanting ions of an impurity having the same conductivity type as the base region into the polycrystalline silicon layer by utilizing the second and third insulating regions as masks thereby separating the same into a region implanted with the ions and a non-implanted region; etching the region not-implanted with the ions to insulate and separate the implanted region from the non-implanted region; forming a thermal oxide film on the surface of the substrate and at the same time diffusing an impurity in the ion-implanted region into the same for forming a base contact; removing the insulating film to expose the non-implanted polycrystalline silicon region; diffusing an impurity of the first conductivity type into the exposed polycrystalline silicon region to form an emitter region of the first conductivity type in the base region of the semiconductor substrate; and forming wiring layers in the ion-implanted region and in the regions diffused with the impurity of the first conductivity type.

According to another embodiment of this invention, there is provided a method of manufacturing a bipolar transistor comprising the steps of; successively forming on a semiconductor substrate of a first conductivity type a first polycrystalline silicon layer, a first insulating film having a first etching characteristic, a second insulating film having a second etching characteristic and a third insulating film having a third etching characteristic, the second insulating film having an impurity concentration which increases from a portion thereof in contact with the first insulating film upwardly; selectively etching the third insulating film in accordance with a predetermined pattern; etching the second insulating film, by using remaining portions of the third insulating film as a mask, to a point inwardly spaced from an edge of the third insulating film to form a second insulating region of an inverted frustum shape; implanting ions of an impurity into the second and first insulating films by using the remaining portion of the third insulating film; removing portions of the second and first insulating films implanted with the ions; heating the first polycrystalline silicon layer about the first insulating region not-implanted with the ions of the first insulating film to thermally-oxidize the first polycrystalline silicon layer to the surface of the substrate by using the remaining first insulating region as a mask thereby forming a base region window; forming undoped second polycrystalline silicon layer over the entire surface of the substrate; implanting ions of an impurity of the first conductivity type by using the second polycrystalline silicon layer deposited on the inverted frustum shaped second insulating region as a mask for converting the first and second polycrystalline silicon layers into a region implanted with the ions and a region partially exposed and not-implanted with the ions; etching the exposed and non-implanted region for forming an island shaped polycrystalline silicon region having a top portion projecting into the first insulating region, the island shaped polycrystalline silicon region being insulated and separated from the polycrystalline silicon region implanted with the ions; removing the second insulating region; etching the region implanted with the ions to change the same to have a predetermined shape; heating the substrate to form a thermal oxide film on the surface of the substrate and at the same time to cause the impurity in the polycrystalline silicon region implanted with the ions and in contact with the substrate to diffuse thereinto for forming a base contact of the first conductivity type; implanting ions of an impurity of the first conductivity type into a regin on the surface of the substrate connected to the base contact thus forming a base region; removing the first insulating film on the non-implanted polycrystalline silicon region; diffusing an impurity of the first conductivity type in the non-implanted polycrystalline silicon region to form an emitter region of a second conductivity type in the non-implanted polycrystalline silicon region; and forming wiring layers for the region implanted with the ions and for the polycrystalline silicon region diffused with the impurity of the first conductivity type.

According to another embodiment of this invention, there is provided a method of manufacturing a junction type field effect transistor comprising the steps of; successively forming on a semiconductor substrate of a first conductivity type a first polycrystalline silicon layer, a first insulating film having a first etching characteristic, a second insulating film having a second etching characteristic, and a third insulating film having the first etching characteristic, the second insulating film having an impurity concentration which increases from a portion thereof in contact with the first insulating film upwardly; selectively etching the third insulating film in accordance with a predetermined pattern; etching the second insulating film, by using remaining portions of the third insulating film, to a point inwardly spaced from an edge of the third insulating film to form a second insulating region of an inverted frustum shape; implanting ions of an impurity into the third and first insulating films by using the remaining portion of the third insulating film; removing portions of the third and first insulating films implanted with the ions; heating a first polycrystalline silicon layer about the first insulating region not-implanted with the ions of the first insulating film to thermally-oxidize the first polycrystalline silicon layer up to the surface of the substrate by using the remaining first insulating region as a mask; forming an undoped second polycrystalline silicon layer over the entire surface of the substrate; implanting ions of an impurity of the first conductivity type by using the second polycrystalline silicon layer deposited on the inverted frustum shaped second insulating region as a mask for converting the first and second polycrystalline silicon layers into first and second regions implanted with the ions, and a region partially exposed and not implanted with the ions; etching the exposed and non-implanted region to form an island shaped first polycrystalline silicon region having a portion projecting into the first insulating region, the island shaped polycrystalline silicon region being insulated and separated from the polycrystalline silicon region implanted with the ions; removing the second insulating region; etching the region implanted with the ions to change the same to have a predetermined shape; heating the substrate to form a thermal oxide film on the surface of the substrate and at the same time to cause the impurity in the polycrystalline silicon region implanted with the ions and in contact with the substrate to diffuse thereinto for forming a base contact of the first conductivity type; implanting ions of the first conductivity type into a region on the surface of the substrate connected to the base contact thus forming a base region; removing the first insulating film on the non-implanted polycrystalline silicon region; diffusing an impurity of the first conductivity type in the non-implanted polycrystalline silicon region to form a gate region on the surface of the substrate; and forming wiring layers for the region implanted with the ions and for the polycrystalline silicon region diffused with the impurity of the first conductivity type.

According to another embodiment of this invention, there is provided a method of manufacturing a bipolar transistor comprising the steps of; successively forming on a semiconductor substrate of a first conductivity type a first polycrystalline silicon layer, a first insulating film having a first etching characteristic, a second insulating film having a second etching characteristic, and a third insulating film having the first etching characteristic, the second insulating film having an impurity concentration which increases from a portion thereof in contact with the first insulating film upwardly; selectively etching the third insulating film in accordance with a predetermined pattern; etching the second insulating film, by using remaining portions of the third insulating film as a mask, to a point inwardly spaced from an edge of the third insulating film to form a second insulating region of an inverted frustum shape; implanting ions of an impurity into the third and first insulating films by using the remaining portion of the third insulating film; removing portions of the third and first insulating films implanted with the ions; heating a first polycrystalline silicon layer about the first insulating region notimplanted with the ions of the first insulating film to thermally oxidize the first polycrystalline silicon layer up to the surface of the substrate by using the remaining first insulating region thereby forming a base region window; forming an undoped second polycrystalline silicon layer over the entire surface of the substrate; implanting ions of an impurity of the first conductivity type by using the second polycrystalline silicon layer deposited on the inverted frustum shaped second insulating region as a mask for converting the first and second polycrystalline silicon layers into a region implanted with the ions and a region partially exposed and not-implanted with the ions; etching the exposed and non-implanted region to form an ion-implanted polycrystalline silicon region and a relatively thin non-implanted polycrystalline silicon region implanted with the ions, and disposed adjacent to the ion-implanted polycrystalline silicon region; oxidizing the relatively thin non-implanted polycrystalline silicon region to insulate and separate the ion-implanted region from the non-implanted region, the insulated and separated polycrystalline silicon region implanted with the ions having an edge projecting from a portion at or near the substrate, the non-implanted polycrystalline silicon region being in the form of a mesa having edges of a positive coefficient of gradient between a portion thereof at or near the substrate and the top of the mesa, the oxidation step causing an impurity in the ion-implanted region to diffuse into the substrate to form a base contact of the first conductivity type; forming a base region by implanting ions of an impurity of the first conductivity type into a region on the substrate surface connected to the base region; removing the first insulating film from the non-implanted polycrystalline silicon region; diffusing an impurity of the first conductivity type into the non-implanted polycrystalline region so as to form an emitter region of the second conductivity type in the base region in the substrate surface; and forming wiring layers for the polycrystalline silicon region implanted with the ions and for the polycrystalline silicon region diffused with the impurity of the first conductivity type.

BRIEF DESCRIPTION DRAWINGS

In the accompanying drawings:

FIG. 9 is a sectional view showing the entire construction of a bipolar transistor prepared by the method shown in FIGS. 8A through 8R;

DESCRIPTION OF THE PREFERRED EMBODIMENTS

Figure 1:
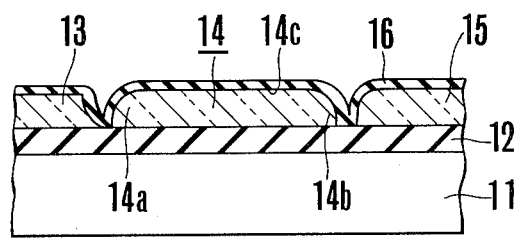
FIG. 1 is a sectional view showing the basic construction of a semiconductor device embodying the invention.

The semiconductor device shown in FIG. 1 comprises a silicon semiconductor substrate 11, a thermal oxide film ($SiO_2$) 12 having a thickness of about 0.6 micron and formed on the substrate 11 and polycrystalline silicon layers 13, 14 and 15 doped with boron and overlying the $SiO_2$ film. The surfaces of the polycrystalline silicon layers 13, 14 and 15 and the exposed surface of the substrate are covered by an oxide film 16.

It is particularly to be noted that the opposite edges 14a and 14b of the polycrystalline silicon layer 14 are gradually curved and that these edges are interconnected by a flat central portion 14c. The right hand polycrystalline silicon layer 15 has a similar edge construction whereas the left hand polycrystalline silicon layer 13 has a conventional mesa type edge construction.

With such convex edge construction it is possible to increase the current capacity over that of the mesa type construction when the polycrystalline silicon layer 14 is used as a wiring layer or a diffused layer. More particularly, with the edge construction of this invention, the sectional area of the edge is increased 200% over that of the mesa type edge construction.

In addition to the aforementioned increase in the current capacity, the edge construction of this invention can reduce the longitudinal dimension of respective polycrystalline layers under that of the mesa type edge construction without changing the other dimensions, with the result that it is possible to increase the density of component elements or integrated circuits formed on a substrate of a given size.

Figure 2E:
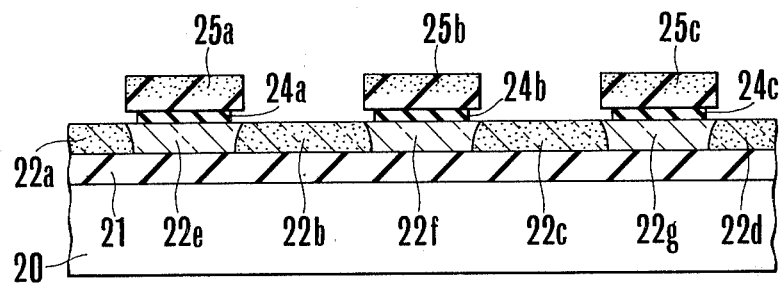
FIGS. 2A through 2K are sectional views showing successive steps of manufacturing the semiconductor device shown in FIG. 1 in accordance with one embodiment of the method of this invention.
Figure 2F:
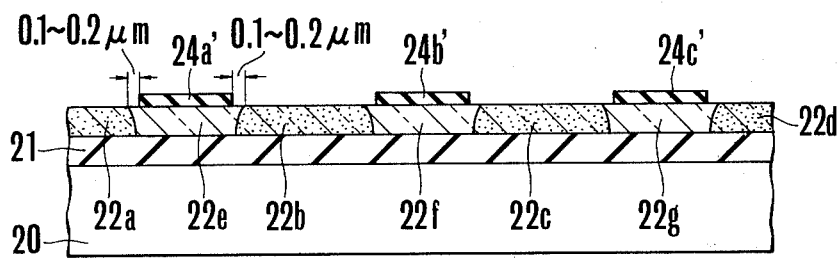
Figure 2G:
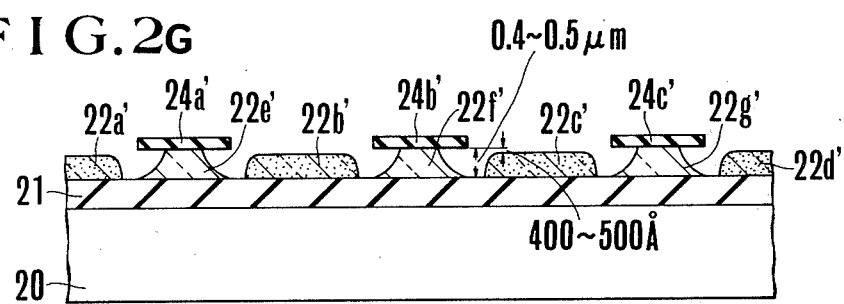
Figure 2A:
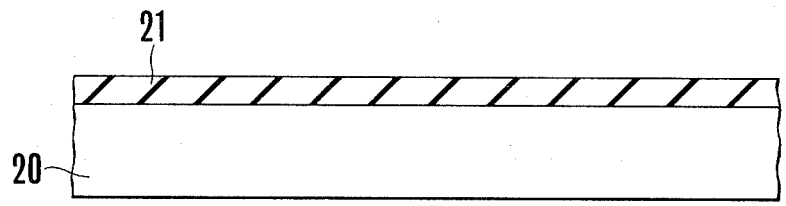
Figure 2B:
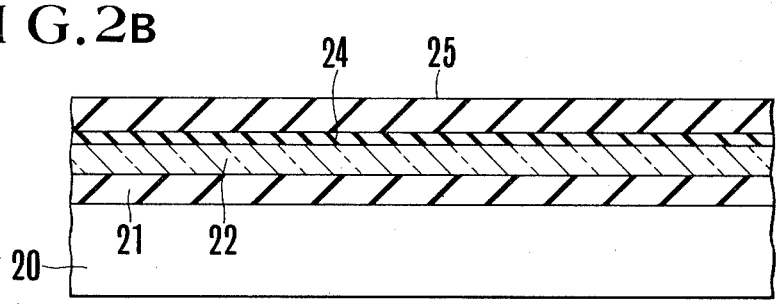

FIGS. 2A through 2K show successive steps of manufacturing the semiconductor device shown in FIG. 1. At first, an N or P type silicon substrate 20 shown in FIG. 2A is prepared and a thermal oxide film 21 ($SiO_2$) having a thickness of 0.6 micron is formed on the substrate. Then, an undoped polycrystalline silicon layer 22 is formed on the $SiO_2$ film 21 by the CVD technique, for example, to a thickness of 0.4–0.5 micron. Then, an $Si_3N_4$ film 24 having a thickness of 0.12 micron is formed on the polycrystalline silicon layer 22, after which an $SiO_2$ film 25 having a thickness of about 0.5–0.6 micron is formed on the $Si_3N_4$ film 24. This stage of the method is shown by FIG. 2B.

Then after coating a well known photoresist (not shown) on the silicon oxide film 25, the photoresist is exposed to light through a photomask and then etched.

Figure 2C:
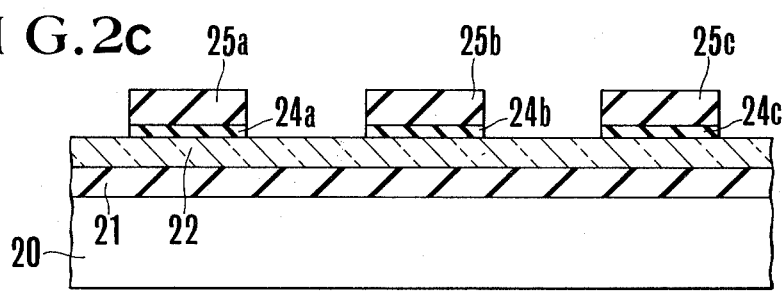
Figure 2D:
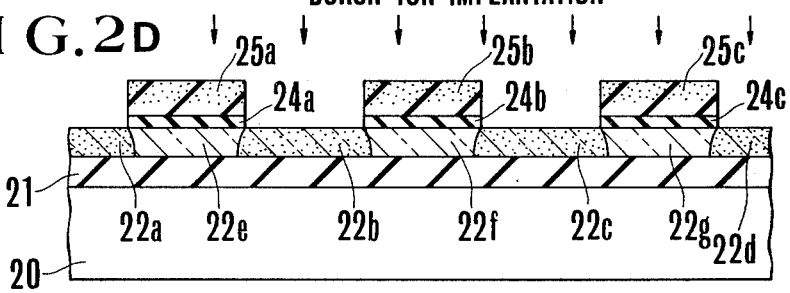

Then the SiO₂ film 25 is etched with an etching solution containing hydrofluoric acid by using the remaining photoresist as a mask. Thereafter, the Si₃N₄ film 24 is etched with hot phosphoric acid. The etching of the SiO₂ film may be dry etching. This state of the method is shown in FIG. 2C in which 25a–25c and 24a–24c show the SiO₂ regions and the Si₃N₄ regions, respectively, remaining after the etching step. The edges of these regions are substantially vertical.

Next, boron is injected into the exposed surface of the substrate by an ion implantation technique to a dose of about $1 \times 10^{15} - 10^{16}$ atoms/cm². The ion implantation may be made once or several times under an implantation energy of 20–150 kev, with the result that boron of the described dose distributes about a plane at a depth of about 0.2–0.4 micron. The boron ions implanted into the polycrystalline silicon collide against the polycrystalline silicon so that the ion-implanted regions 22a, 22b, and 22e and 22d in the polycrystalline silicon layer 22 are contiguous with non-implanted regions 22c, 22f and 22g. Of course, the interfaces between ion-implanted regions 22a–22d and non-implanted regions 22e–22g are defined by the edges of the Si₃N₄ film which has been used as a mask at the time of ion implantation.

Following the ion implantation, the assembly is heat treated at a temperature of 800° C. for 15–20 minutes to recover crystal damage caused by the ion implantation. In this manner, ion-implanted regions or electroconductive regions 22a–22d are formed.

Next, portions of the Si₃N₄ films 24a–24c at about 0.2–0.3 micron from the edges are etched off with hot phosphoric acid. This stage is shown in FIG. 2E. As can be noted from FIG. 2E, edge portions of the polycrystalline silicon regions 22e–22g and covered by Si₃N₄ films 24a–24c are exposed.

Then the SiO₂ regions 25a–25c are removed by using hydrofluoric type etching solution. This state is shown in FIG. 2F. Next, etching is done with potassium hydroxide (KOH) at a temperature of 60° C.–63° C. for 3 to 4 minutes. The etching speed at this time of the not-implanted regions 22e–22g is higher by one order of magnitude than that of the implanted regions 22a–22d. Accordingly, when etched under the conditions described above, the sides of the non-implanted regions 22e–22g are etched by 0.4–0.5 microns whereas the implanted regions are etched by about 460–500 Å which is smaller about one order of magnitude than that of the non-implanted regions. Consequently, the shape of the regions 22e–22g is converted into frustum or mesa type regions 22e'–22g' having side surfaces inclined upwardly with their tops separated inwardly from the edges of the Si₃N₄ films 24a'–24c' by about 0.4–0.5 microns, whereas the regions 22a–22d are converted to have a configuration as shown by 22e'–22g' in which the edges are slightly rounded because their surfaces are etched at a definite rate and at a uniform speed. This stage is shown in FIG. 2G. Thus, the edges of the regions 22a'–22d' are convex starting from the insulating film 21 or a portion close thereto.

Figure 2H:
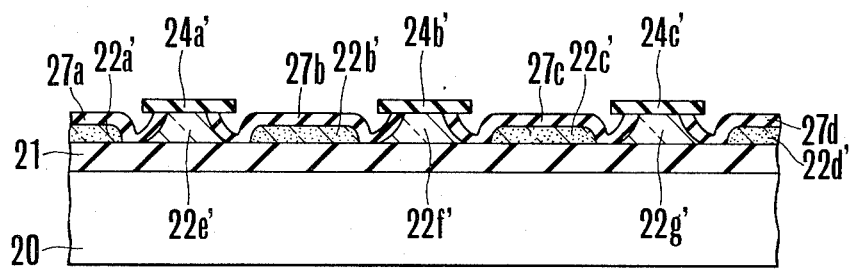

Thereafter thermal oxide films 27a–27d are formed on the entire surface to a thickness of 0.2–0.3 microns, under a stage shown in FIG. 2H. Since the Si₃N₄ films 24a'–24c' are difficult to oxidize, they are oxidized only slightly so that their shape does not change in any appreciable extent. However, side surfaces of the non-implanted regions 22e'–22g' and located at recessed portions underlying these Si₃N₄ films 24a'–24c' are also formed with SiO₂ films 27a–27d having a uniform thickness as shown in FIG. 2H.

Figure 2I:
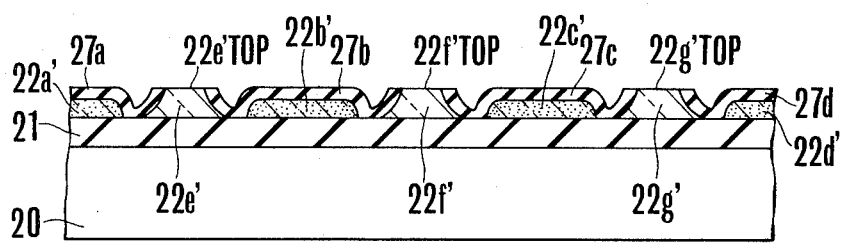

Then the oxide films on the surface of the Si₃N₄ films 24a'–24c' are removed by etching with dilute hydrofluoric acid for about 10 seconds for example, and then the Si₃N₄ films 24a'–24c' are removed by etching with phosphoric acid at 160° C. for 30 minutes. This stage is shown in FIG. 2I. As shown, the top surfaces 22e' top-22g' top of the non-implanted regions 22e'–22g' are exposed.

Figure 2J:
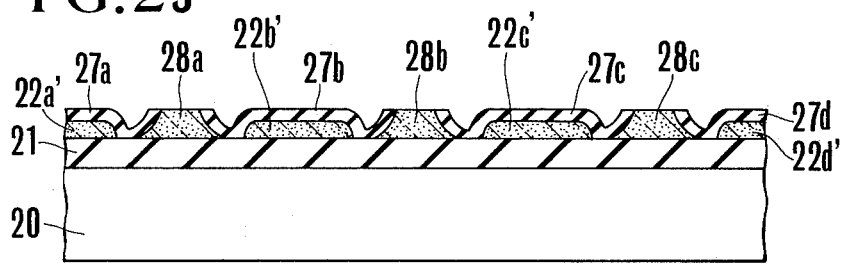

Then, an impurity such as phosphor, arsenic or boron is injected into the regions 22e'–22g' by an ion implantation or heat diffusion technique through the top surfaces 22e' top–22g' top of the regions 22e'–22g' by using SiO₂ films 27a–27d as masks thus converting these regions into electroconductive regions 28a–28c as shown in FIG. 2J.

Figure 2K:
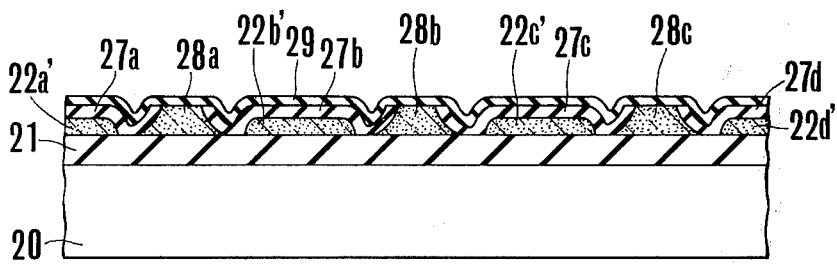

Finally, a thermal heat oxide film 29 is deposited over the entire surface as shown in FIG. 2K. The resulting regions 22a'–22d' and 28a–28c can be used as wiring layers, electrodes or resistance layers which are formed very closely, for example with a spacing of about 0.5–1 micron.

When respective layers are formed as above described, in addition to the forementioned advantages in the construction, the following advantages result.

More particularly, in the step of manufacturing the resistance or wiring layer, the photomask is used only once, and adjacent regions are formed by using the edges of the insulating mask layer which has already been formed with the photomask, thus providing a self-aligning process. This substantially decreases the number of process steps. Although the edges of a photoresist pattern are used, the spacing between adjacent regions is determined by the thickness of the polycrystalline silicon layer constituting such regions and by the etching time of this layer, especially the portions thereof not implanted with ions.

Accordingly, it is possible to separate and insulate adjacent regions with small gaps of the order of less than 1 micron. This differs greatly from the prior art in which the spacing between adjacent regions is determined by a mask pattern. Thus, when the method of this invention is applied to the manufacture of wirings, it is possible to increase the density of the wirings by a factor of 2 or more. Moreover, the spacing between adjacent regions is not influenced by the working accuracy of the photoetching step.

As shown in FIG. 2H, with the method described above, the insulating films Si₃N₄ overlying the regions not-imparted with ions and the insulating film (SiO₂) overlying another portions have different etching characteristics so that in order to diffuse an impurity into the non-implanted regions, it is only necessary to etch off the insulating films overlying the non-implanted regions and diffusion can be effected by using the other insulating films as masks.

Figure 3A:
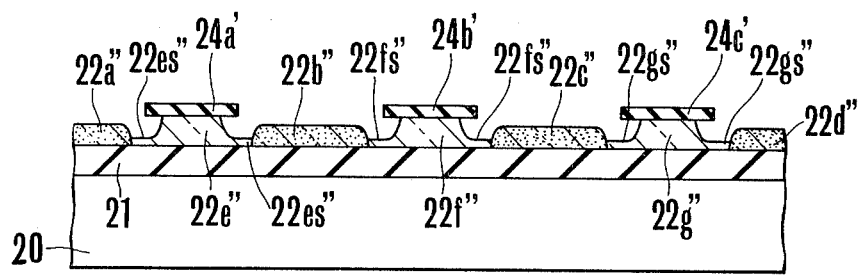
FIGS. 3A and 3B show modified steps for the method shown in FIG. 2.
Figure 3B:
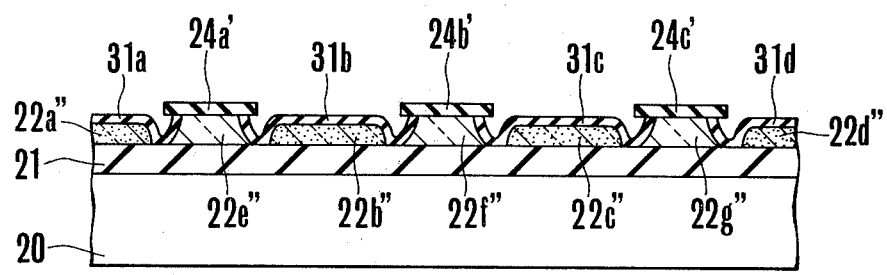

FIGS. 3A and 3B show modifications of certain steps shown in FIGS. 2A–2K. Thus, FIG. 3A corresponds to FIG. 2G. Thus, when etching the non-implanted polycrystalline silicon regions 22e–22g in the step shown in FIG. 2F, KOH is used for etching conditions of 60°–63° C. and 2 minutes. Then, portions 22es"–22gs" adjacent regions 22a"–22d" which were obtained from regions 22e"–22g" by etching are not removed completely to expose the oxide films as shown in FIG. 2G, but these portions 22es"–22gs" are retained with a thickness of about 1200–1500 Å.

Then oxide films 31a–31d having a thickness of about 0.24–0.3 microns are formed on the entire surface of the substrate by thermal oxidation process. Then, the exposed surfaces of respective regions are oxidized. Although the thickness of the portion of respective regions which are converted into oxide films is different depending upon the temperature and time, where oxidation conditions 800° C. and 600 minutes are used, regions 22es''–22gs'' are completely oxidized to assume a state as shown in FIG. 3B. With this modified method, it is also possible to isolate regions 22a'–22c' and regions 22e'–22g' with insulating films having a small thickness in the same manner as shown in FIG. 2H.

FIGS. 4A–4M show still another modification of the method of this invention applied for the fabrication of a bipolar transistor.

Figure 4A:
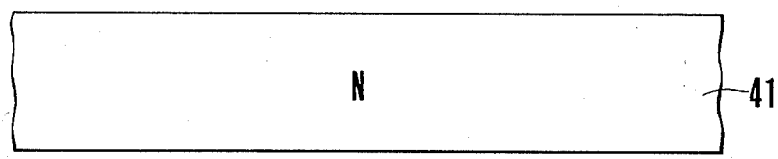
FIGS. 4A through 4M are sectional views showing successive steps of manufacturing a bipolar transistor according to the method of this invention.
Figure 4B:
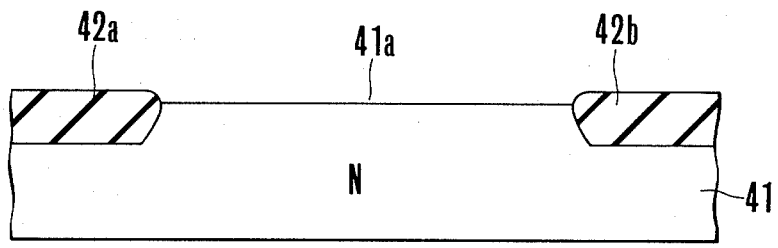

At first, as shown in FIG. 4A, a N type silicon semiconductor substrate 41 having a resistivity of 1 ohm-entimeter is prepared. Then, thermal oxide films 42a and 42b are formed on the surface of the substrate with well known photomask technique, except a portion 41a thereof which is used as a window for forming the base electrode of the transistor as will be described hereinafter. This stage is shown in FIG. 4B.

Figure 4C:
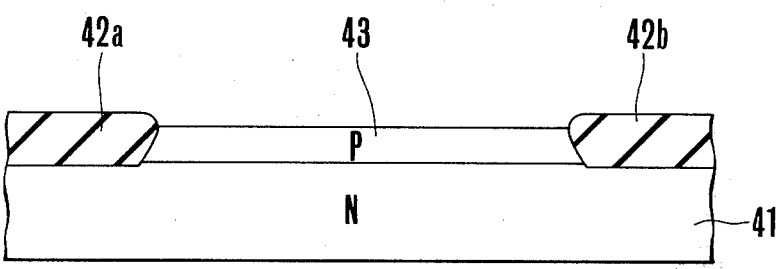

Then, a P type impurity ions are diffused or injected into the substrate 41 to a thickness of 0.2–0.3 microns through window 41a of the oxide films 42a and 42b to form a base region 43 as shown in FIG. 4C. The resulting impurity concentration at the surface of the base region 43 is about $1-5 \times 10^{18}$ atoms/cm$^3$.

Figure 4D:
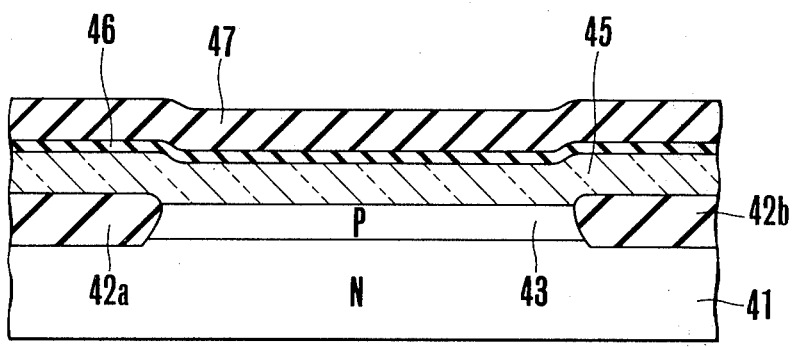

Then, by using CVD process, for example, a non-doped polycrystalline silicon layer 45 is formed on the entire surface of the substrate to a thickness of 0.4–0.5 microns. Then, on this polycrystalline silicon layer 45 is formed a $Si_3N_4$ film 46 having a thickness of about 0.12 microns, and thereafter an oxide film 47 having a thickness of about 0.5–0.6 microns is formed on the nitride film 46 as shown in FIG. 4D.

Figure 4E:
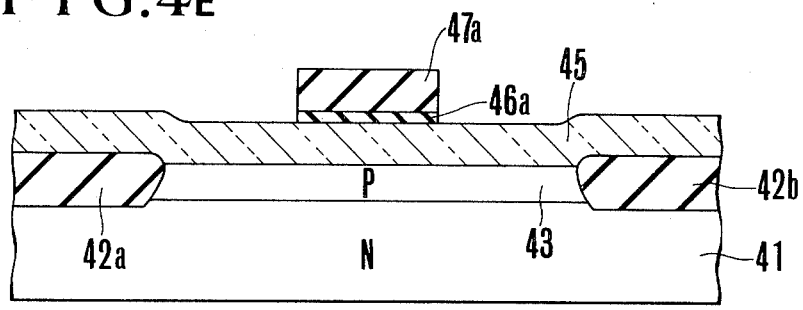

After coating a well known photoresist (not shown) on the oxide film 47, a photomask is used to expose to light the photoresist and then etch the same. Then $SiO_2$ film 47 is etched with a hydrofluoric acid etchant by using the remaining photoresist followed by the etching step of the $Si_3N_4$ with hot phosphoric acid. Thereafter, the photoresist which has been used as a mask is removed. This stage is shown in FIG. 4E, in which the $SiO_2$ region and the $Si_3N_4$ region remaining after the etching step are designated by 47a and 46a respectively. The edges of these regions are used for isolating the regions to be described later.

Figure 4F:
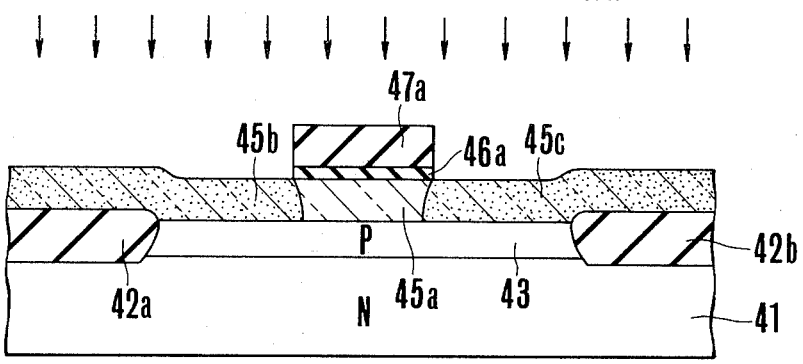

Then, as shown in FIG. 4F, ions of boron are implanted into the entire surface of the substrate to a dose of $1 \times 10^{15}-1 \times 10^{16}$ atoms/cm$^2$. Such implantation may be made one or more times, and the energy of ion implantation ranges from 40 kev to 120 kev thus distributing the ions of boron about a plane at a depth of 0.1–0.4 microns. In the same manner as in the foregoing embodiments, the boron ions implanted into the polycrystalline silicon collide with silicon crystals so that the ion-implanted regions 45b and 45c gradually change to not-implanted regions 45a. After the ion-implantation, the assembly is heat-treated at 800° C. for 15–20 minutes, for example, thus recovering from the damage of the crystals of the polycrystalline silicon caused by the ion implantation step.

Figure 4G:
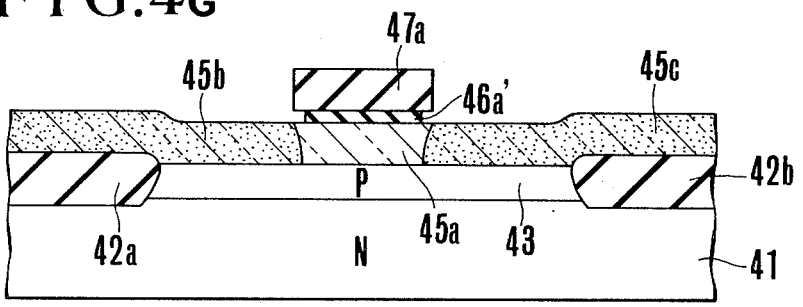

Portions of the $Si_3N_4$ film 46a between its edges and points spaced 0.2 to 0.3 microns therefrom are etched off with hot phosphoric acid, as shown in FIG. 4G. This etching step exposes a non-implanted portion of the polycrystalline silicon region 45a.

Figure 4H:
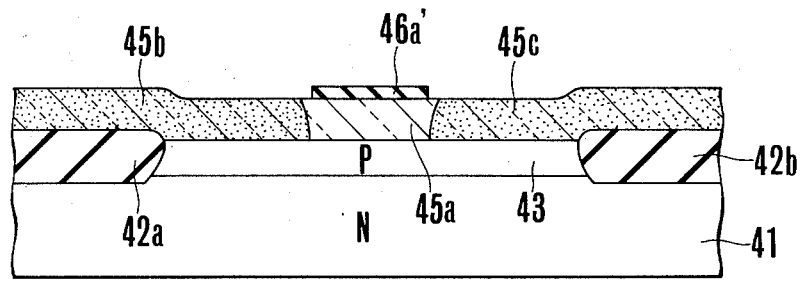

At a stage shown in FIG. 4H, the assembly is etched with an alkaline etchant, for example KOH, at a temperature of 60°–63° C. for 3 minutes. With KOH, the etching speed of the non-implanted region 45a is faster by about one order of magnitude than that of the implanted regions 45b and 45c. Consequently, when etched under the conditions described above, the non-implanted region 45a is side etched by 0.4–0.5 microns, whereas the ion-implanted regions 45b and 45c are side etched by 400–500 Å which is smaller by one order of magnitude. Consequently, the configuration of the region 45a is changed to a region 45a' of a frustum form having inwardly inclined side surfaces with top ends terminating at points 0.4–0.5 microns inward from the edges of the $Si_3N_4$ film, whereas the regions 45b and 45c are changed to regions 45b' and 45c' having surfaces slightly etched. Accordingly, the edges of regions 45b and 45c are slightly rounded. Thus, the edges of the regions confronting the region 45a' are not etched, thus preserving the interfaces between the regions at the time of ion implantation. Regions 45b' and 45c' are used as the base electrode, or a combined electrode and wiring layer of a transistor as will be described later. The edges of the regions 45b'' and 45c' facing the undoped region 45a' are convex with a negative slope. The spacing between these isolated regions is less than 1 micron.

Figure 4I:
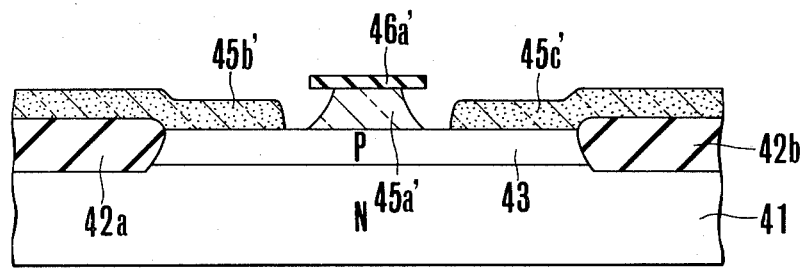
Figure 4J:
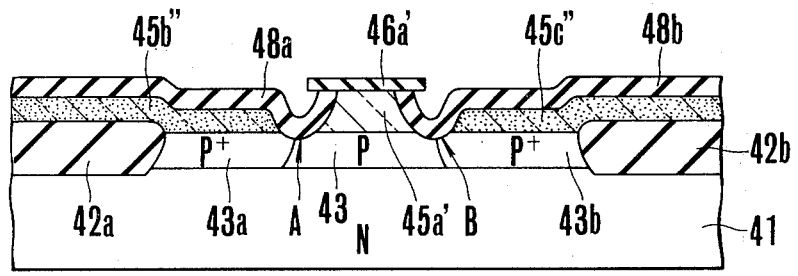

Next, under a stage shown in FIG. 4I thermal oxide films 48a and 48b are formed on the entire surface to a thickness of 0.2–0.3 microns. Although the $Si_3N_4$ film 46a' is slightly oxidized, its configuration does not change to any appreciable extent. The $SiO_2$ films 48a and 48b are also formed uniformly on the side surfaces of the non-implanted region 45a' underlying the $Si_3N_4$ film 46a'. During the step of forming the thermal oxide films 48a and 48b, the P type impurity or boron in the regions 45b' and 45c' adjoining the region 43 is heat-diffused into the P type region 43 to form P$^+$t regions 43a and 43b in the regions 43 which act as base contact. This stage is shown in FIG. 4J.

Figure 4K:
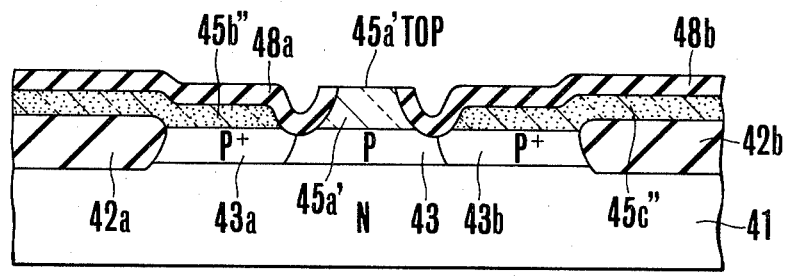

Unstable portions (not shown) of the oxide films 48a and 48b are removed with hydrofluoric acid and then etched with phosphoric acid at a temperature of 160° C. for 30 minutes to remove the $Si_3N_4$ film 46a'. This stage is shown in FIG. 4K showing that the top 45a' top of the non-implanted region 45a' has been exposed.

Figure 4L:
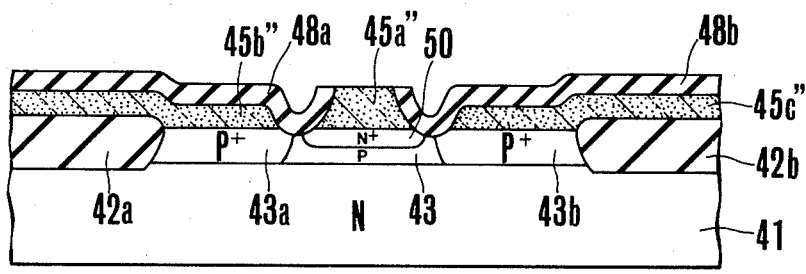

An N type impurity such as phosphoror arsenic is heat diffused into the top 45a' top of the non-implanted polycrystalline silicon region 45a' by using the $SiO_2$ films 48a and 48b as masks, under diffusion conditions of 950° C. and 20 minutes (for arsenic). As a consequence, the impurity diffuses through region 45a' into the base region 43 to a thickness of 0.1–0.2 microns and a surface concentration of about $1 \times 10^{20}$ atoms/cm$^3$ thereby forming an N$^+$ emitter region 50. The region 45'' is converted into an a N type conductivity region 45a'' by being diffused with the N type impurity, the region 45a' acting as an emitter electrode or a combined emitter electrode and a wiring layer. This stage is shown in FIG. 4L.

Figure 4M:
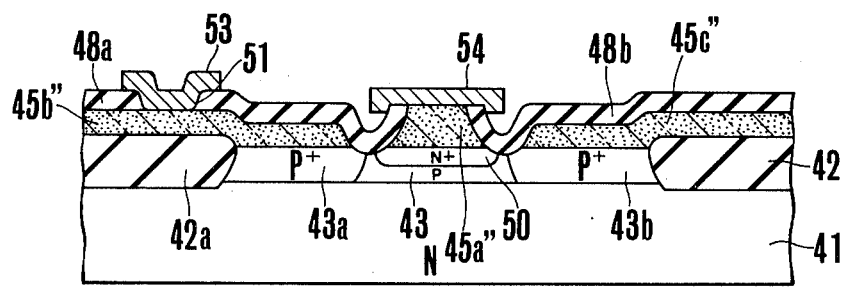

Next, a window 51 is formed through a proper portion of the oxide film 48a disposed over the region 45b'' to be utilized as a base electrode or a combined base electrode and wiring layer. Then, metal (for example, aluminum) wiring layers 53 and 54 are formed on the region 45b'' and on the top of the region 45a'' through the window 51 by using a predetermined mask, as shown in FIG. 4M. Thus, a transistor is provided which utilizes the substrate 41 as the collector region, the region 43 as the base region, regions 43a and 43b as the base contact region, the region 50 as the emitter region, the regions 45b" and 45c" as the base electrode, and the region 45a" as the emitter electrode. Although the collector electrode is not shown, it is formed by a well known method on the lower surface of the substrate, or on the upper surface thereof like other electrodes.

In the bipolar transistor thus formed, as it is possible to dispose regions 45b", 45a" and 45c" acting as electrodes with spacings of less than one micron it is possible to decrease the base electrode and to decrease the collector-base parasitic capacitance, over those of prior art transistors. Further, this construction increases the density of the wirings by a factor of 2 resulting in an ultra high speed, and lower power IC transistor having a power delay product of several tens $f_J$ and a propagation delay time of about 100 ps/gate.

With this construction, it is also possible to make one cell of a static bipolar RAM to be less thatn 1000 square microns with a conventional light exposure technique (minimum dimension—2 microns).

Since the construction of the element is simple and since the manufacturing steps are also simple, it has been found by experiment that the electric characteristics of the transistors do not vary greatly and the heat resistant property is also more stable than the prior art transistors.

Further, with this construction, since the emitter region takes the form of a mesa and is remotely situated from the P+ contact region, it is possible to greatly increase the insulating strength between emitter and base electrodes. The semiconductor device manufactured by this method is substantially flat.

Figure 5A:
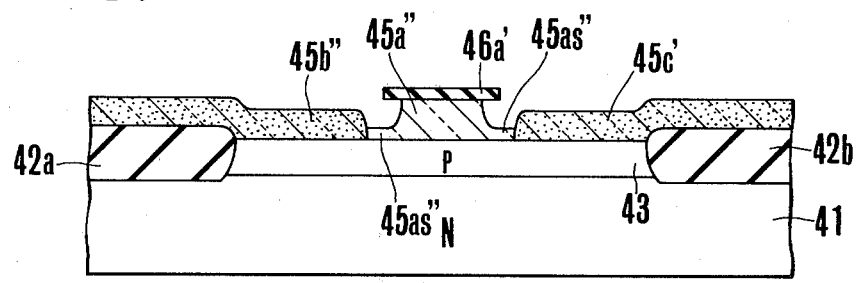
FIGS. 5A and 5B show modified steps for the method shown in FIG. 4
Figure 5B:
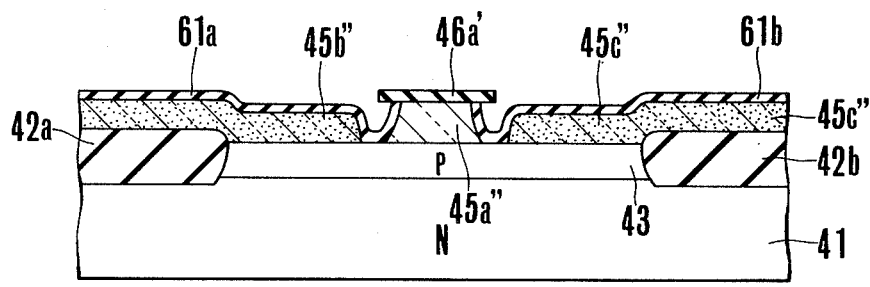

FIGS. 5A and 5B show modifications of FIGS. 4A-4M which correspond to that shown in FIGS. 3A and 3B. More particularly, at the step shown in FIG. 4H, the polycrystalline silicon non-implanted region 45a is etched with KOH at 60°-63° C. for about two minutes. Then, as shown in FIG. 4I, the region 45a is not etched until the P type region 43 becomes exposed; rather a thickness of about 1200-1500 Å is allowed to remain as shown by a portion 45as" shown in FIG. 5.

Then, oxide films 61a and 61b having a thickness of 0.24-0.3 microns is formed on the entire surface of the substrate by a thermal oxidation method, as shown in FIG. 5B. The oxidation conditions are 800° C. and about 600 minutes. Then, the region 45as" is also oxidized completely.

Consequently, regions 45b", 45c" are insulated and separated from the region 45a" with oxide films having extremely small width on the surface of the substrate. 45b" and 45c" show that their thickness is slightly smaller than that of the regions 45b' and 45c' because of longer oxidation time.

Figure 6:
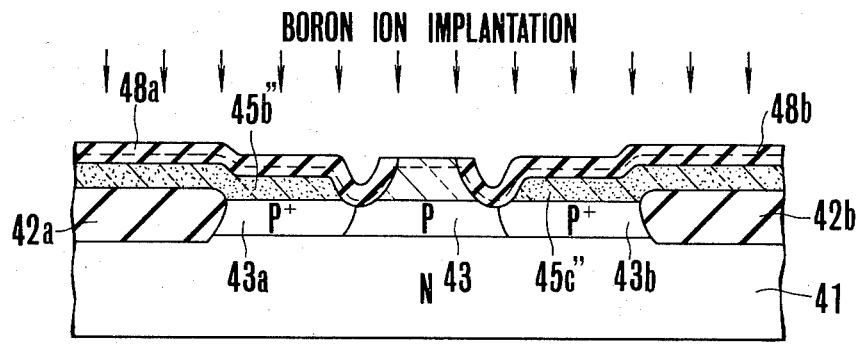
FIG. 6 is a sectional view showing a modification of a steps shown in FIG. 4.

FIG. 6 shows a modification of the invention of FIGS. 4A-4M. More particularly, under a stage shown in FIG. 4I, when oxide films 48a and 48b are formed on the surface of a substrate as shown in FIG. 4J, these oxide films 48a and 48b are formed at a portion at which the region 43 (forming the base region) is exposed. Consequently, the P type impurity near the interface between the substrate and the oxide films is absorbed by the oxide films thus tending to produce an N channel at this portion. To prevent this difficulty, subsequent to the step shown in FIG. 4K, a P type impurity is implanted at a dose of $10^{13}$-$10^{14}$ atoms/cm$^2$ such that the peak of the ions reaches the bottom of the oxide film as shown in FIG. 6. At this time, the P type impurity is also injected into the region 45a' but this does not cause any trouble because a high concentration N type impurity is diffused later into this region. Since the P type impurity injected into the oxide films 48a and 48b overlying the regions 45b' and 45c' is the same as the impurity contained in the regions 45b' and 45c' no problem occurs.

Following the step shown in FIG. 6, the step shown in FIG. 4K and the remaining steps are executed.

Figure 7A:
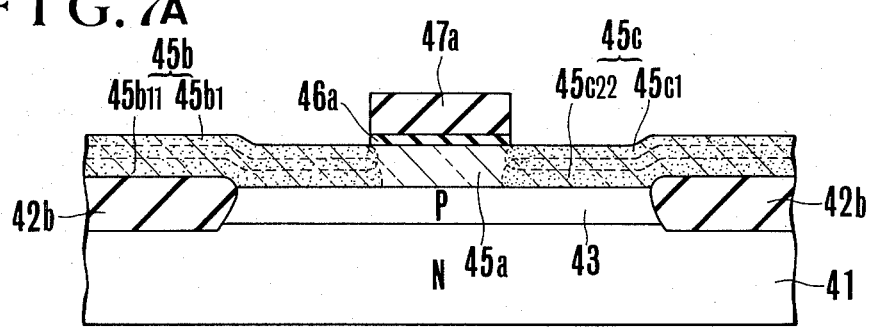
FIGS. 7A and 7B are sectional views showing modifications of the method shown in FIG. 4.
Figure 7B:
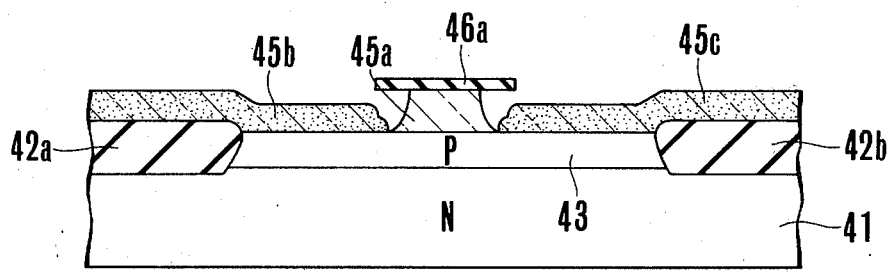

FIGS. 7A and 7B show a modification of the invention of in FIGS. 4A-4M, wherein the number of times of the ion implantation executed in the step shown in FIG. 4F is increased to two. At first, a P type impurity is implanted at a dose of $5 \times 10^{15}$ atoms/cm$^2$ and under an implantation energy of 40 kev such that the peak of the impurity reaches a relatively shallow depth, for example a depth of 1000 Å, of the region 45 (in the case of a polycrystalline silicon having a thickness of 5000 Å).

As a result of this ion implantation, P type regions 45b1 and 45b2 are formed in region 45. Then, the P type impurity is implanted at a dose of $5 \times 10^{15}$ atoms/cm$^2$ and an implantation energy of 120 kev such that the peak appears at a depth of about 4000 Å from the surface, thus forming P type regions 45b11 and 45b22 in the region 45.

The regions 45b11 and 45b22 formed by the second ion implantation extend toward the non-implanted region 45a beyond the regions 45b1 and 45b2. Thus, the regions 45b and 45c formed by the regions 45b1, 45b11, 45b2 and 45b22 project into the non-implanted region 45a thus not only minimizing the thickness of the insulator to be formed subsequently between the regions 45b and 45c but also increasing the effective cross-sectional area of the regions 45b and 45c. FIG. 7B shows the insulated and separated stage. As can be noted from FIG. 7B the edges of the regions 45b and 45c facing the region 45 sharply stand up from the substrate, then slowly stand up and the connect to the upper surface through steep slopes. Consequently, the edges are generally of convex form.

Figure 8A:
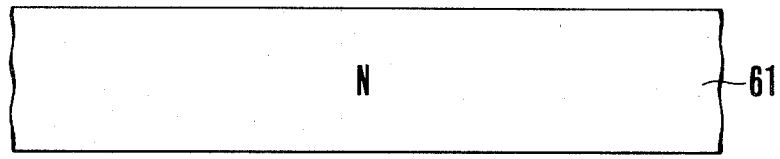
FIGS. 8A through 8R are sectional views showing another embodiment of the method of manufacturing a bipolar transistor according to this invention.
Figure 8B:
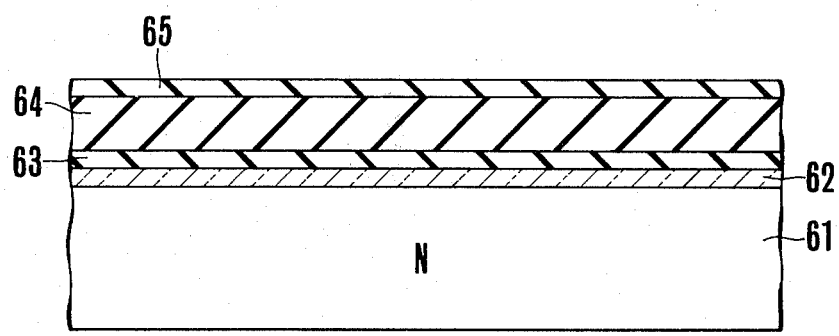
Figure 8C:
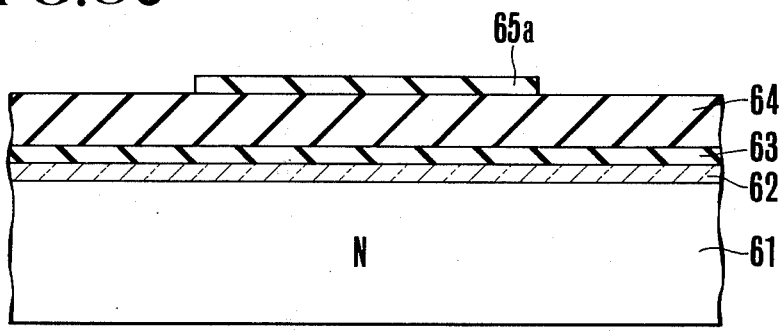
Figure 8D:
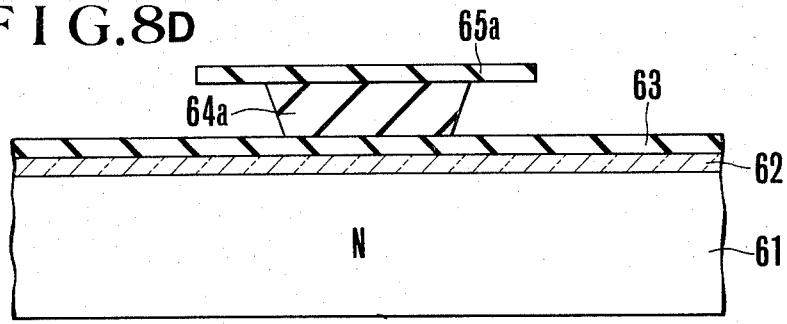
Figure 8E:
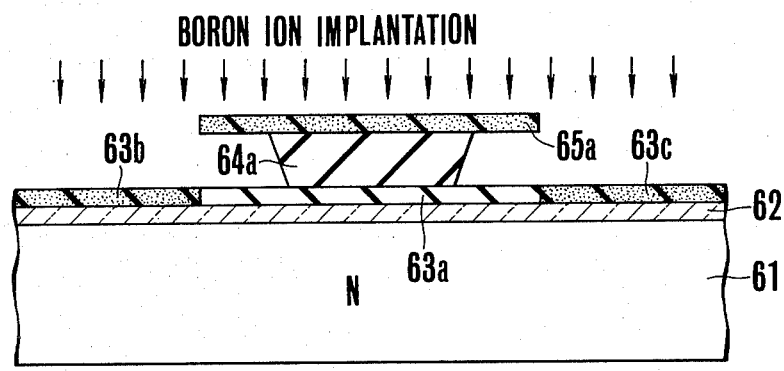
Figure 8F:
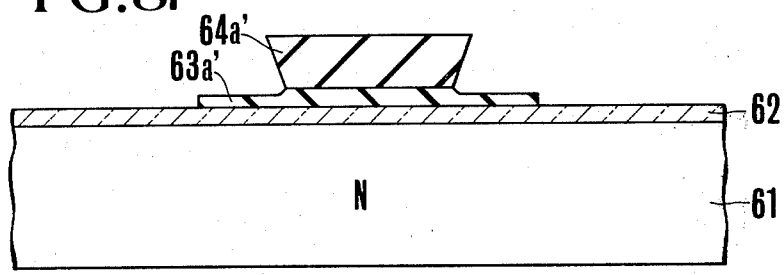
Figure 8G:
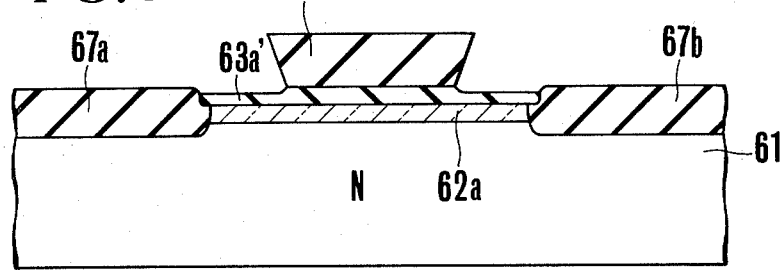
Figure 8H:
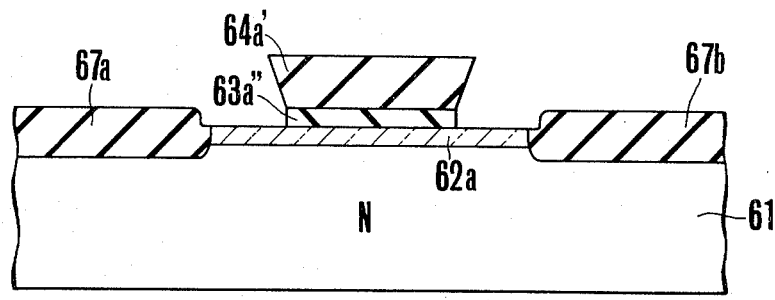
Figure 8I:
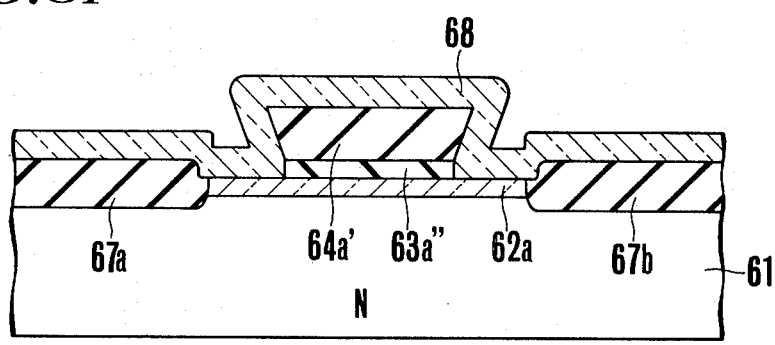
Figure 8J:
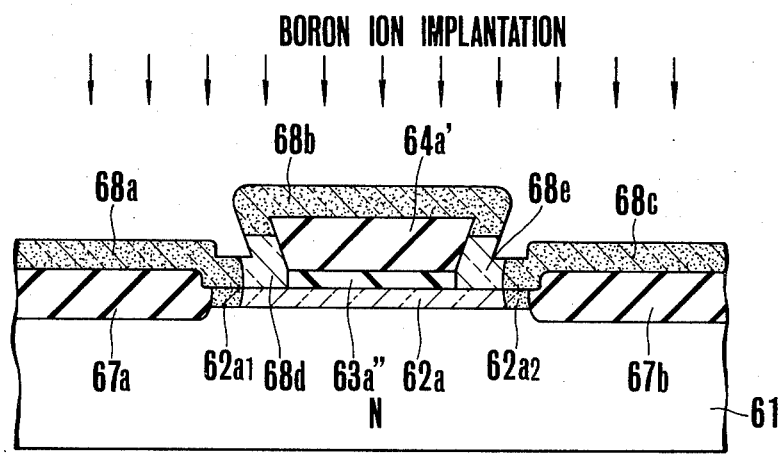
Figure 8K:
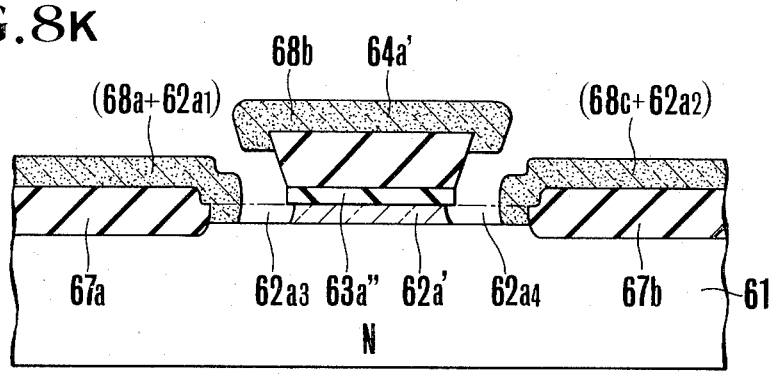
Figure 8L:
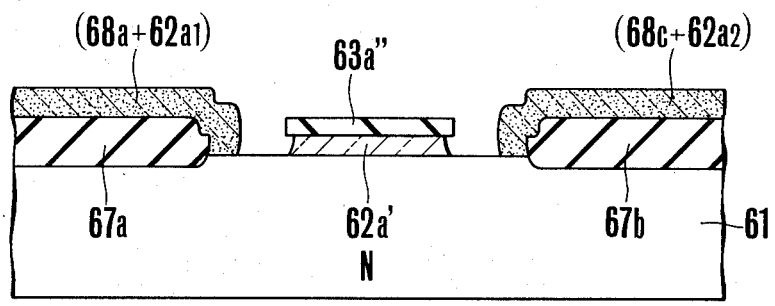
Figure 8M:
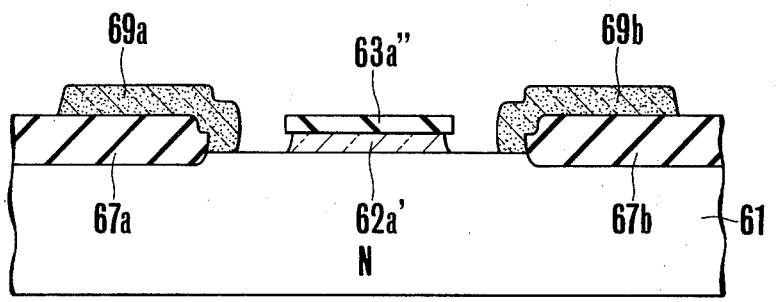
Figure 8N:
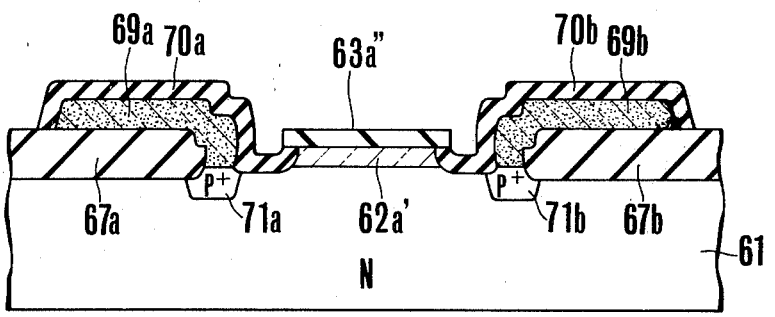
Figure 8Q:
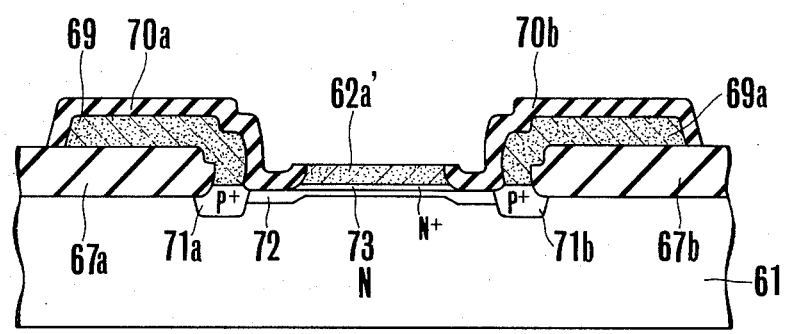
Figure 8R:
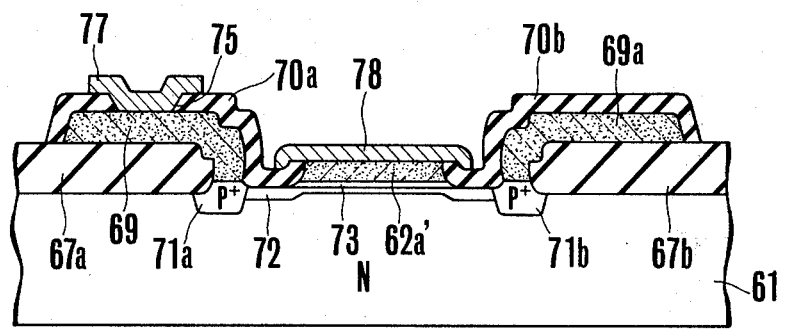

FIG. 8A-8R show still another embodiment of the semiconductor device according to this invention.

As shown in FIG. 8A, at first a N type semiconductor substrate 61 having a resistivity of 1 ohm-cm is prepared. On the main surface of this substrate is formed an undoped polycrystalline silicon layer 62 having a thickness of 0.2 micron by the well known CVD process. Then a silicon nitride (Si$_3$N$_4$) film 63 having a thickness of 0.12 microns is formed on the polycrystalline silicon layer 62 and then a silicon oxide film 64 (SiO$_2$) is formed thereon to a thickness of 0.6 microns. During the step of forming the oxide film 64, the concentration of the impurity is graded in the direction of thickness so that the concentration of the P type impurity such as boron increases upwardly. The concentration gradient is such that the boron concentration is substantially zero near the Si$_3$N$_4$ film 63 but reaches about 2% near the upper surface. Such concentration gradient is useful for shaping this portion into an inverted frustum in the succeeding steps.

Then a Si$_3$N$_4$ film having a thickness of about 0.1 micron is formed on the SiO$_2$ film 64. This stage is shown in FIG. 8B.

Next, the Si$_3$N$_4$ film is shaped into a desired pattern 65a by a well known selective etching technique, for example plasma etching technique. This stage is shown in FIG. 8C. Then the $SiO_2$ film 64 is etched by using the region 65a as a mask. It should be noted that the impurity concentration of the $SiO_2$ film 64 increases upwardly. Such difference in the impurity concentration can be realized by changing the etching speed of the $SiO_2$ film 64 for a buffer etchant, that is a hydrofluoric type etching solution. In other words, the etching speed is higher by about 2-3 times at a low impurity concentration portion than at a high impurity concentration portion so that as shown in FIG. 8D, the $SiO_2$ film becomes an inverted frustum 64a. The etching condition at this time is about 1200 seconds for hydrofluoric acid. The upper portion of the region 64a is etched to a point about 0.7 microns inwardly spaced from the edges of the $Si_3N_4$ film 65a whereas the lower surface is etched to a point about 1.2 microns inwardly spaced. This stage is shown in FIG. 8D.

Thereafter, boron ions are implanted into the entire surface of the substrate by using the $Si_3N_4$ film 65a as a mask, under the conditions of 40 kev and a dose higher than $1\times10^{15}$ atoms/cm$^2$. This stage is shown in FIG. 8E. As shown, the $Si_3N_4$ film 63 is divided into a non-implanted region 63a and ion-implanted regions 63b and 63c by using the $Si_3 N_4$ film 65a as the mask.

Then ion-implanted regions 63b, 65a and 63c are removed with a phosphoric acid etchant. The etching is made by utilizing the fact that the etching speed of the implanted $Si_3N_4$ film is 3-4 times faster than that of the not-implanted region. The etching completed stage is shown in FIG. 8F.

The exposed portions of non-implanted regions 64a and 63a are slightly etched by the phosphoric acid etchant and converted into the regions 64a' and 63a'.

Next, the surface of the substrate is thermally-oxidized at a temperature of 1100° C. for 40 minutes by using regions 64a' and 63a' as masks, thus forming oxide films 67a and 67b having a thickness of about 6 microns as shown in FIG. 8G. As a consequence of forming these oxide films, the polycrystalline silicon layer 62 is converted into an island region 62a. Then, exposed portions of the nitride film 63a' on the polycrystalline silicon region 62a are removed with a phosphoric acid etchant by using the oxide films 67a and 67b as masks. This stage is shown in FIG. 8H. The conditions at this time are 160° C. and 20 minutes.

Thereafter, a non-doped polycrystalline silicon layer 68 is uniformly formed on the entire surface of the substrate by the CVD process to a thickness of 3000–4000 Å. This stage is shown in FIG. 8I.

At this stage, ions of boron are implanted at a dose of more than $1\times10^{15}$ atoms/cm$^2$ and with an energy of 40-120 kev. The ion implantation is made in a direction perpendicular to the substrate so that portions not seen from above are not implanted with ions. Accordingly, the polycrystalline silicon layer 68 comprises ion-implanted regions 68a, 68b and 68c and non-implanted regions 68d and 68e. Since the base on which the polycrystalline silicon layer is deposited is an inverted frustum, the silicon layer is concealed by the edges of the region 68b. The ions of boron are also implanted into the portions 62a1 and 62a2 of the polycrystalline silicon region 62 positioned immediately beneath layer 68.

Then, at the stage shown in FIG. 8J, the assembly is heat treated at 800° C. for 15-20 minutes for recovering the damage to the layers 68a, 68b, 68c1, 62a1 and 62a caused by ion implantation.

Following the heat treatment, regions 68d, 68e, 62a1 and 62a2 are removed by using an alkaline etchant, KOH for example. Regions 62a3 and 62a4 are in direct contact or spaced a little from non-implanted region 62a', as shown in FIG. 8K. The polycrystalline silicon region 62a' remaining after removal of regions 62a3 and 62a4 has a mesa shape, and the length of its upper surface is slightly shorter than the length between opposite edges of $Si_3N_4$ film 63a'' deposited thereon.

The portions of the regions (68a+62a1) and (68c+62a2) facing the region 62a' are of convex shape projecting from the substrate with negative slope.

Then, the oxide film 64a' is etched off with a phosphoric acid etchant. At the same time, the doped polycrystalline silicon region 68b deposited on the oxide film 64a' is also removed. This stage is shown in FIG. 8L.

Next the polycrystalline silicon regions (68a+62a1) and (68c+62a2) are etched by using a predetermined mask to form wiring layers and or electrodes 69a and 69b. This stage is shown in FIG. 8M. Then, the substrate is thermally oxidized to cover the polycrystalline silicon regions 68a and 69a, the exposed portion of the substrate, and the side surface of the polycrystalline silicon region 62a' with oxide films 70a and 70b, under a thermal oxidizing condition of 800° C. The resulting films have a thickness of 2000-3000 Å. As a result of this thermal oxidation treatment, the impurity contained in the polycrystalline silicon regions 69a and 69b adjacent the surface of the substrate 61 diffuses into the substrate thus forming $P_+$ diffused regions 71a and 71b contiguous to these regions 69a and 69b. The depth of diffusion is about 0.3 to 0.4 microns, and these P+ diffused regions are used as the base contact region as will be described later. FIG. 8N shows this stage. The oxide film formed directly on the substrate 61 somewhat penetrates into the substrate.

Ions of boron are implanted into the upper surface of the substrate in a direction perpendicular thereto under conditions of dose of $10^{13}$–$10^{14}$ atoms/cm$^2$ and an implantation energy of 60-90 kev. The resulting region 72 is contiguous with the P+ regions 71a and 72b to form a base region. This stage is shown in FIG. 8O. The nitride film 63a is then removed with a phosphor acid containing etchant and the N type impurity is caused to diffuse into the undoped region 62a' whereby an N+ region 73 acting as an emitter region is formed in the surface of the substrate 61 adjacent the base region 72. Both sides of this emitter region 73 is covered by the thermal oxides 70a and 70b and formed as a mesa. This stage is shown in FIG. 8Q.

Next a window 75 is formed at a suitable portion of the oxide film 70a on the polycrystalline silicon layer 69 acting as the base electrode by using a well known photoetching technique, and a metal such as aluminum is vapor deposited onto the window 75 and onto the top of the region 62a' by a well known mask technique to form wiring layers 77 and 78. This stage is shown in FIG. 8R.

FIG. 9 shows a general construction of an integrated circuit (IC) incorporated with a transistor prepared by the steps shown in FIGS. 8A-8R. In FIG. 9, elements identical to or manifesting the same performances as those shown in FIG. 8R are designated by the same reference characters. The integrated circuit shown in FIG. 9 comprises a P type semiconductor layer 80 which constitutes a substrate together with an N type semiconductor layer 61, an N+ type buried layer 81 interposed between both semiconductor layers 61 and 80 which are used as a collector contact. As can be noted from FIG. 9, a portion of buried layer 81 extends to the surface of the substrate. The integrated circuit also comprises a collector electrode constituted by a polycrystalline silicon layer 83 in contact with the collector contact 81 at the surface of the substrate. The region 83 is formed at the same time as the emitter electrode 62a' and diffused with an impurity. There are also provided a wiring layer 84 made of metal such as aluminum and formed on the collector electrode, and oxide film 85.

This construction provides ultra high speed elements having a propagation delay time of the order of 60 ps/gate. Similar to the foregoing embodiments, this integrated circuit prepared by a conventional light exposure technique enables reduction of the cell area of a static bipolar RAM to less than 1000 square microns.

Where this construction is applied to an IC, as it is possible to greatly decrease the area of an external base region, it is possible to increase the $f_T$ of a reverse operation transistor, thus ensuring a high speed operation. When fabricating the IC of the construction described above by forming printed regions of the transistor in the base region, on the configuration of the base pattern is determined succeeding steps are self-aligned so that all steps before forming the electrode can be executed without using any photomasks. For this reason, it is possible to completely eliminate all problems involving position alignment and high working accuracy which have been indispensable for all photoetching steps in the base region. This permits the manufacture of extremely fine transistors.

Figure 10A:
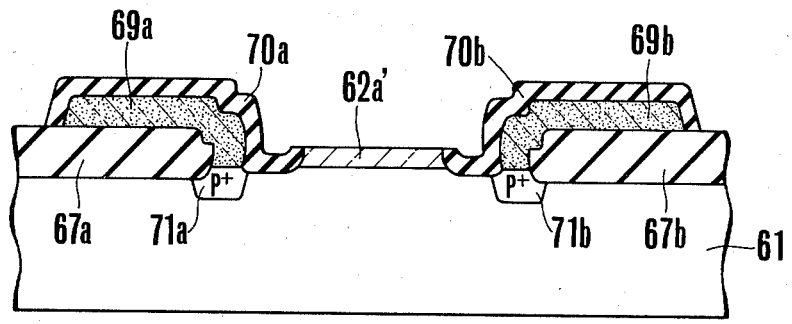
FIGS. 10A through 10C are sectional views showing modified steps where the method of the invention shown in FIGS. 8A through 8R is applied to the manufacture of a junction transistor.
Figure 10B:
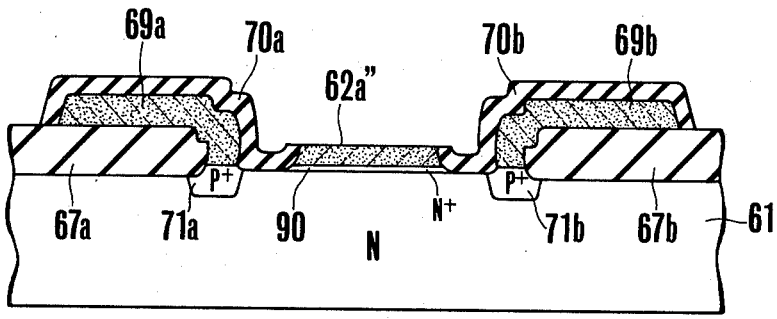
Figure 10C:
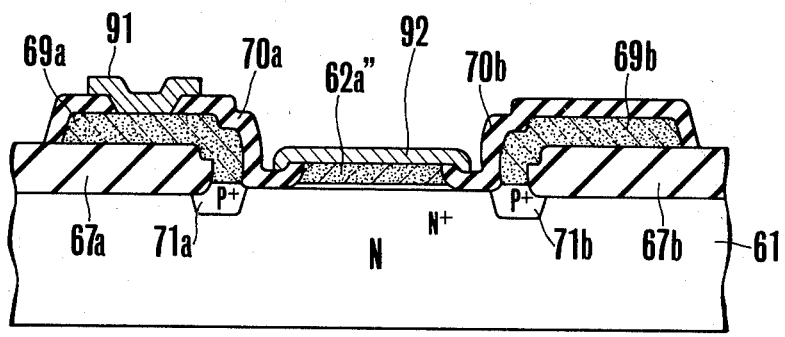

FIGS. 10A–10C show various steps of manufacturing a junction type field effect transistor in accordance with the invention. To prepare this transistor, succeeding to the method shown in FIG. 8N, without performing the ion implantation step shown in FIG. 8O, the step is advanced to the step shown in FIG. 10A, and the region 63a' is removed by etching with a phosphoric acid etching solution.

Then a P or N type impurity is diffused into the region 62a' so as to form a gate electrode region 90 in a region bounded by oxide films 70a and 70b on the semiconductor substrate 61. The region 62a'' diffused with the impurity is used as a gate electrode or a wiring layer. This stage is shown in FIG. 10B.

Next, similar to the step shown in FIG. 8R, metal wiring layers 91 and 92 are formed. This stage is shown in FIG. 10C.

The advantages provided by this construction are substantially identical to those of the previous embodiment.

Figure 11A:
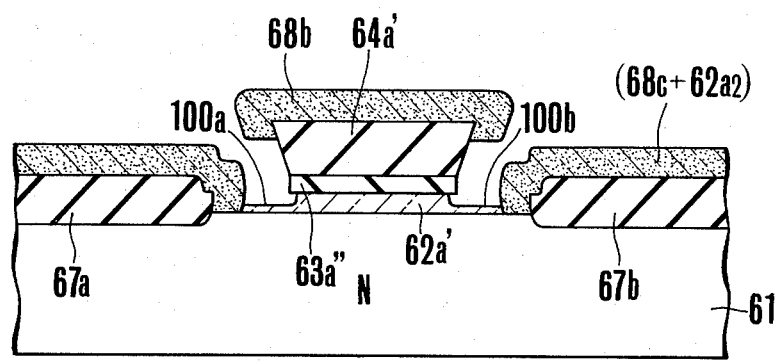
FIGS. 11A and 11B show modified steps of the method shown in FIGS. 8A through 8R.
Figure 11B:
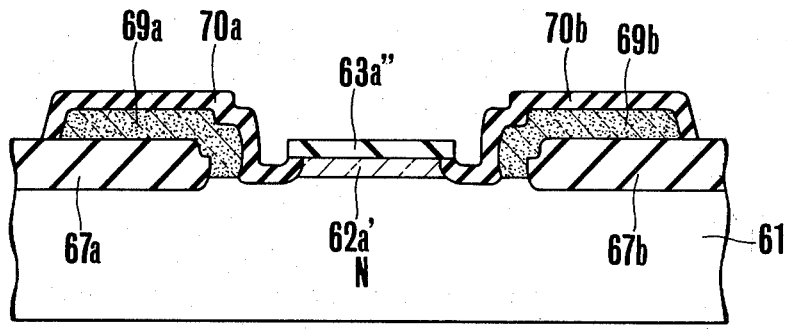

FIGS. 11A and 11B show a modified embodiment of this invention, in which after the process step shown in FIG. 8J, when removing non-implanted regions 68d and 68e by etching, these regions are not etched until the surface of the substrate becomes exposed, thus leaving regions 100a and 100b. The succeeding steps are similar to those shown in FIGS. 8L and 8M. After completing the step 8M, a thermal oxide film is formed on the substrate. At this time, the non-implanted regions 100a and 100b are oxidized into oxide films which are shaped to slightly project into the surface of the substrate. This stage is shown in FIG. 11B which corresponds to FIG. 8N. The succeeding steps are similar to the steps shown in FIGS. 8O–8R.

It should be understood that the invention is not limited to the specific embodiments described above and that various changes and modification will be obvious to one skilled in the art.

What is claimed is:

1. A method of manufacturing a bipolar transistor comprising the steps of:
    selectively oxidizing a semiconductor substrate of a first conductivity type to form a first insulator region extending into said substrate and to simultaneously form a base diffusion window surrounded by said region;
    forming a base region having a second conductivity type through said window;
    forming a polycrystalline silicon layer, and second and third insulating layers having different etching characteristics, on said substrate;
    selectively etching said third insulating layer to form a third insulation region on said base region and near the central portion thereof;
    etching said second insulating layer to form a second insulating region by using said third insulating region as a mask;
    implanting ions of an impurity having the same conductivity type as said base region into said polycrystalline silicon layer by utilizing said second and third insulating regions as masks, thereby separating the same into a region implanted with said ions and a region not implanted with said ions;
    side etching said second insulating region for exposing said non-implanted polycrystalline silicon region;
    etching said non-implanted region to insulate and separate said implanted region from said non-implanted region;
    forming a thermal oxide film on the surface of said substrate and at the same time diffusing an impurity in said ion implanted region contiguous to said base region into the same to form a base contact;
    removing said insulating film to expose said non-implanted polycrystalline silicon region;
    diffusing an impurity of said first conductivity type into said exposed polycrystalline silicon region to form an emitter region of said semiconductor substrate, and
    forming wiring layers in said ion-implanted region and in said regions diffused with said impurity of said first conductivity type.

2. The method according to claim 1 wherein after removing said second insulating film, ions of an impurity of a second conductivity type are implanted such that the peak of said ions appears at a depth substantially equal to the thickness of said thermal oxide film overlying said substrate.

3. The method according to claim 1 wherein said step of implanting ions into said polycrystalline silicon layer is executed a plurality of times such that peaks of said implanted ions appear at different depths.

4. A method of manufacturing a bipolar transistor comprising the steps of:
    selectively oxidizing a semiconductor substrate of a first conductivity type to form a first insulator region extending into said substrate and to simultaneously form a base diffusion window surrounded by said region;
    forming a base region having a second conductivity type through said window;
    forming a polycrystalline silicon layer, and second and third insulator layers having different etching characteristics, on said substrate;

selectively etching said third insulating layer to form a third insulating region on said base region and near the central portion thereof;

etching said second insulating layer to form a second insulating region by using said third insulating region as a mask;

side etching said second insulating region to expose a portion of said polycrystalline silicon region not to be implanted with ions of an impurity having the same conductivity type as said base region;

implanting said ions into said polycrystalline silicon layer by utilizing said second and third insulating regions as masks thereby separating the same into a region implanted with said ions and a region not implanted with said ions;

etching said non-implanted region to insulate and separate said implanted region from said non-implanted region;

forming a thermal oxide film on the surface of said substrate and at the same time diffusing an impurity in said ion-implanted region into the same to form a base contact;

removing said insulating film to expose said non-implanted polycrystalline silicon region;

diffusing an impurity of said first conductivity type into said exposed polycrystalline silicon region to form an emitter region of the first conductivity type in said base region of said semiconductor substrate, and forming wiring layers in said ion-implanted region and in said regions diffused with said impurity of said first conductivity type.

5. A method of manufacturing a bipolar transistor comprising the steps of:

successively forming on a semiconductor substrate of a first conductivity type, a first polycrystalline silicon layer, a first insulating film having a first etching characteristic, a second insulating film having a second etching characteristic and a third insulating film having said first etching characteristic;

said second insulating film having an impurity concentration which increases from a portion thereof in contact with said first insulating film upwardly towards said third film;

selectively etching said third insulating film in accordance with a predetermined pattern;

etching said second insulating film, by using remaining portions of said third insulating film as a mask, to a point inwardly spaced from an edge of said third insulating film to form a second insulating region of an inverted frustum shape;

implanting ions of an impurity into said second and first insulating films by using the remaining portion of said third insulating film as a mask;

removing portions of said third and first insulating films implanted with said ions to expose said third insulating region, and a first insulating region in said first insulating film;

heating the first polycrystalline silicon layer about said first insulating region of said first insulating film to thermally oxidize said first polycrystalline silicon layer up to the surface of said substrate by using the remaining first insulating region as a mask thereby forming a base region window;

removing portions of said first insulating region lying between the thermally oxidized first polycrystalline silicon layer and the bottom of said second insulating region to expose non-oxidized portions of said first polycrystalline silicon layer;

forming an undoped second polycrystalline silicon layer over the entire surface of said substrate;

implanting ions of an impurity of a second conductivity type by using the second polycrystalline silicon layer deposited on the inverted frustum shaped second insulating region as a mask for converting said first and second polycrystalline silicon layers into a region implanted with the ions and a region partially exposed and not implanted with the ions;

etching said exposed and not implanted region to form an island shaped polycrystalline silicon region having a top portion projecting into said first insulating region, said island shaped polycrystalline silicon region being insulated and separated from said polycrystalline silicon region implanted with said ions;

removing said second insulating region;

heating said substrate to form a thermal oxide film on the surface of said substrate and at the same time to cause the impurity in said polycrystalline silicon region implanted with the ions and in contact with said substrate to diffuse thereinto to form a base contact of the second conductivity type;

implanting ions of an impurity of the second conductivity type into a region on the surface of said substrate connected to said base contact thus forming a base region.

removing said first insulating film on the polycrystalline silicon region not implanted with said ions;

diffusing an impurity of the first conductivity type in said polycrystalline silicon region not implanted with said ions for forming an emitter region of a first conductivity type in said polycrystalline silicon region not implanted with said ions, and forming wiring layers for said region implanted with the ions and for said polycrystalline silicon region diffused with said impurity of the first conductivity type.

6. A method of manufacturing a bipolar transistor comprising the steps of:

successively forming, on a semiconductor substrate of a first conductivity type, a first polycrystalline silicon layer, a first insulating film having a first etching characteristic, a second insulating film having a second etching characteristic, and a third insulating film having said first etching characteristic;

said second insulating film having an impurity concentration which increases from a portion thereof in contact with said first insulating film upwardly towards said third film;

selectively etching said third insulating film in accordance with a predetermined pattern;

etching said second insulating film by using remaining portions of said third insulating film as a mask, to a point inwardly spaced from an edge of said third insulating film to form a second insulating region of an inverted frustum shape;

implanting ions of an impurity into said third and first insulating films by using the remaining portion of said third insulating film as a mask;

removing portions of said third and first insulating films implanted with the ions to expose said second insulating region and a first insulating region in said first insulating film;

heating a first polycrystalline silicon layer about said first insulating region not implanted with said ions of said first insulating film to thermally oxidize said first polycrystalline silicon layer up to the surface of said substrate by using the remaining first insulating region thereby forming a base region window;

removing portions of said first insulating region lying between the thermally oxidized first polycrystalline silicon layer and the bottom of said second insulating region to expose non-oxidized portions of said first polycrystalline silicon layer;

forming an undoped second polycrystalline silicon layer over the entire surface of said substrate;

implanting ions of an impurity of a second conductivity type by using the second polycrystalline silicon layer deposited on the inverted frustum shaped second insulating region as a mask for converting said first and second polycrystalline silicon layers into a region implanted with the ions and a region partially exposed and not implanted with the ions;

etching said exposed and not implanted region to form a non-implanted polycrystalline silicon region and a relatively thin polycrystalline silicon region not implanted with the ions and disposed adjacent to said ion-implanted polycrystalline silicon region;

removing said second insulating regions;

oxidizing said relatively thin polycrystalline silicon region not implanted with the ions to insulate and separate said ion implanted and not implanted polycrystalline silicon regions;

said insulated and separated polycrystalline silicon region implanted with the ions having an edge projecting from a portion at or near said substrate, said polycrystalline silicon region not implanted with the ions being in the form of a mesa having edges of a positive coefficient of gradient between a portion thereof at or near said substrate and the top of said mesa, said oxidizing step causing an impurity in said ion-implanted region to diffuse into said substrate to form a base contact of the second conductivity type;

forming a base region by implanting ions of an impurity of the second conductivity type into a region on said substrate surface connected to said base region;

removing said first insulating film on said polycrystalline silicon region not implanted with the ions; and diffusing an impurity of the first conductivity type into said polycrystalline region not implanted with the ions; so as to form an emitter region of the first conductivity type in said base region in said substrate surface and forming wiring layers for said polycrystalline silicon region implanted with the ions and for said polycrystalline silicon region diffused with said impurity of the first conductivity type.

* * * * *